US012677526B2

(12) United States Patent
Liu et al.

(10) Patent No.: US 12,677,526 B2
(45) Date of Patent: Jul. 7, 2026

(54) LIGHT EMITTING DEVICE COMPRISING ALTERNATING SUBJECT AND OBJECT SUBLAYERS, DISPLAY SUBSTRATE AND DISPLAY DEVICE

(71) Applicant: BOE Technology Group Co., Ltd., Beijing (CN)

(72) Inventors: Xiaoyun Liu, Beijing (CN); Liangliang Kang, Beijing (CN); Xiaohu Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 374 days.

(21) Appl. No.: 18/281,675

(22) PCT Filed: Nov. 24, 2022

(86) PCT No.: PCT/CN2022/134090
§ 371 (c)(1),
(2) Date: Sep. 12, 2023

(87) PCT Pub. No.: WO2024/108492
PCT Pub. Date: May 30, 2024

(65) Prior Publication Data

US 2025/0072201 A1 Feb. 27, 2025

(51) Int. Cl.
*H10K 50/13* (2023.01)
*H10K 101/00* (2023.01)
*H10K 101/30* (2023.01)

(52) U.S. Cl.
CPC ......... *H10K 50/13* (2023.02); *H10K 2101/27* (2023.02); *H10K 2101/30* (2023.02)

(58) Field of Classification Search
None
See application file for complete search history.

(56) References Cited

U.S. PATENT DOCUMENTS 10,069,096 B1 9/2018 Xu
2011/0291156 A1 12/2011 Shiratori
(Continued)

FOREIGN PATENT DOCUMENTS

CN 102163696 A 8/2011
CN 102916132 A 2/2013
(Continued)

OTHER PUBLICATIONS

Extended (Supplementary) European Search Report dated Dec. 15, 2025, issued in counterpart EP Application No. 22966187.1. (9 pages).

*Primary Examiner* — Nduka E Ojeh
(74) *Attorney, Agent, or Firm* — WHDA, LLP

(57) ABSTRACT

A light emitting device, a display substrate and a display device, relate to the technical field of displaying. The light emitting device including: a plurality of luminescent layers, wherein each of the plurality of luminescent layers includes at least one subject sublayer and at least one object sublayer, and the at least one subject sublayer and the at least one object sublayer are disposed alternately; wherein thicknesses of at least a part of subject sublayers are greater than or equal to a thickness of the object sublayer. The concentration quenching phenomenon of the luminescent layer in the light emitting device is improved, the luminous efficiency is improved, and the service life of the device is extended.

19 Claims, 12 Drawing Sheets

(56) References Cited

U.S. PATENT DOCUMENTS

| | | | | |
|---|---|---|---|---|
| 2014/0131686 | A1 | 5/2014 | Kawakami et al. | |
| 2015/0243918 | A1* | 8/2015 | Sasaki | H10K 50/121 257/40 |
| 2016/0181560 | A1 | 6/2016 | Yamamoto et al. | |
| 2017/0253796 | A1* | 9/2017 | Takeda | C09K 11/06 |
| 2023/0354628 | A1* | 11/2023 | Xiang | H10K 50/11 |
| 2024/0179934 | A1* | 5/2024 | Wang | H10K 50/12 |

FOREIGN PATENT DOCUMENTS

| | | | |
|---|---|---|---|
| CN | 103811667 | A | 5/2014 |
| CN | 104835923 | A | 8/2015 |
| CN | 109786570 | A | 5/2019 |
| CN | 111384252 | A | 7/2020 |
| CN | 112349857 | A | 2/2021 |
| CN | 114843415 | A | 8/2022 |
| JP | H1187056 | A | 3/1999 |

* cited by examiner

LIGHT EMITTING DEVICE COMPRISING ALTERNATING SUBJECT AND OBJECT SUBLAYERS, DISPLAY SUBSTRATE AND DISPLAY DEVICE

TECHNICAL FIELD

The present disclosure relates to the technical field of displaying and more particularly, to a light emitting device, a display substrate and a display device.

BACKGROUND

An organic electroluminescence display (OLED) has advantages such as self-illumination, high brightness, high luminous efficiency, low driving voltage, low energy consumption, and wide operating temperature range, which makes it widely used in the fields of lighting and display. In related art, the host material is doped with the guest material to form a luminescent body. However, this requires a high doping process and is prone to quenching, thereby reducing the luminous efficiency.

SUMMARY

Embodiments of the present application employs the following technical solutions:

in a first aspect, an embodiment of the present application provides a light emitting device, including:

a plurality of luminescent layers, wherein each of the plurality of luminescent layers includes at least one subject sublayer and at least one object sublayer, and the at least one subject sublayer and the at least one object sublayer are disposed alternately;

wherein thicknesses of at least a part of subject sublayers are greater than or equal to a thickness of the object sublayer.

In a light emitting device provided by an embodiment of the present application, thicknesses of a part of the subject sublayers are greater than or equal to the thickness of the object sublayer, and thicknesses of a part of the subject sublayers are less than the thickness of the object sublayer.

In a light emitting device provided by an embodiment of the present application, a thickness of each of the subject sublayers is greater than or equal to the thickness of the object sublayer.

In a light emitting device provided by an embodiment of the present application, the light emitting device further comprises a hole transport layer and an electron transport layer, the plurality of luminescent layers are located between the hole transport layer and the electron transport layer; and an electron mobility of each subject sublayer gradually increases along a direction from the hole transport layer pointing to the electron transport layer.

In a light emitting device provided by an embodiment of the present application, when a total quantity of the subject sublayers is N+1, a minimum distance from a geometric center of a ((N/2)+1)th subject sublayer to the hole transport layer is less than a minimum distance from the geometric center of the ((N/2)+1)th subject sublayer to the electron transport layer; and when the total quantity of the subject sublayers is N, a minimum distance from a geometric center of a (N/2)th subject sublayer to the hole transport layer is less than a minimum distance from the geometric center of the (N/2)th subject sublayer to the electron transport layer, and the minimum distance from the geometric center of the ((N/2)+1)th subject sublayer to the hole transport layer is less than the minimum distance from the geometric center of the ((N/2)+1)th subject sublayer to the electron transport layer; wherein N is an even number.

In a light emitting device provided by an embodiment of the present application, when a total quantity of the subject sublayers is N+1, a 1st subject sublayer is disposed close to the hole transport layer, a (N+1)th subject sublayer is disposed close to the electron transport layer, and a sum of thicknesses from the 1st subject sublayer to a (N/2)th subject sublayer is less than a sum of thicknesses from a ((N/2)+2)th subject sublayer to the (N+1)th subject sublayer; wherein N is an even number.

In a light emitting device provided by an embodiment of the present application, a ratio of a thickness of a subject sublayer with a minimum distance to the electron transport layer being the least to a thickness of an object sublayer with a minimum distance to the electron transport layer being the least is a first value;

a ratio of a thickness of a subject sublayer with a minimum distance to the hole transport layer being the least to a thickness of an object sublayer with a minimum distance to the hole transport layer being the least is a second value; and the first value is greater than or equal to the second value.

In a light emitting device provided by an embodiment of the present application, at least one of the luminescent layers further comprises a doped sublayer, the doped sublayer is located between the subject sublayer and the object sublayer; and in a same luminescent layer, a thickness of the doped sublayer is greater than or equal to at least one of a thickness of the subject sublayer and a thickness of the object sublayer.

In a light emitting device provided by an embodiment of the present application, each of the luminescent layers comprises the doped sublayer, in the same luminescent layer, the thickness of the doped sublayer is greater than or equal to a sum of the thickness of the subject sublayer and the thickness of the object sublayer.

In a light emitting device provided by an embodiment of the present application, each of the luminescent layers comprises a middle area and an edge area surrounding the middle area, a thickness of a part of the doped sublayer located in the middle area is greater than a thickness of a part of the doped sublayer located in the edge area; and a thickness of a part of the subject sublayer located in the middle area is less than a thickness of a part of the subject sublayer located in the edge area, and/or, a thickness of a part of the object sublayer located in the middle area is less than a thickness of a part of the object sublayer located in the edge area.

In a light emitting device provided by an embodiment of the present application, the thickness of the part of the doped sublayer located in the edge area is zero, and the part of the subject sublayer located in the edge area is in direct contact with the part of the object sublayer located in the edge area.

In a light emitting device provided by an embodiment of the present application, materials of the doped sublayer comprise at least one of a material of the subject sublayer and a material of the object sublayer.

In a light emitting device provided by an embodiment of the present application, the doped sublayer comprises a host material and a guest material, the host material of the doped sublayer is the same as the material of the subject sublayer, and the guest material of the doped sublayer is the same as the material of the object sublayer.

In a light emitting device provided by an embodiment of the present application, the material of the object sublayer comprises phosphor materials, a LUMO energy level of the material of the subject sublayer is greater than a LUMO energy level of the material of the object sublayer, and a HOMO energy level of the material of the object sublayer is greater than a HOMO energy level of the material of the subject sublayer; wherein the LUMO energy level is an energy level of a lowest unoccupied molecular orbital, and the HOMO energy level is an energy level of a highest occupied molecular orbital.

In a light emitting device provided by an embodiment of the present application, the thickness of the object sublayer is less than or equal to 3 Å, and the thickness of the subject sublayer is less than or equal to 300 Å.

In a light emitting device provided by an embodiment of the present application, the material of the object sublayer comprises fluorescent materials, the thickness of the object sublayer is less than or equal to 2 Å, and the thickness of the subject sublayer is less than or equal to 150 Å.

In a light emitting device provided by an embodiment of the present application, materials of the object sublayers of a part of the luminescent layers comprise fluorescent materials, and materials of the object sublayers of a part of the luminescent layers comprise phosphor materials;

- a transition layer and the subject sublayer are provided between the object sublayer of the phosphor materials and the object sublayer of the fluorescent materials; and
- the transition layer is located between the subject sublayer and the object sublayer of the phosphor materials, or the transition layer is located between the subject sublayer and the object sublayer of the fluorescent materials; wherein the transition layer comprises a spacer sublayer or a charge transport sublayer.

In a light emitting device provided by an embodiment of the present application, materials of the object sublayers of a part of the luminescent layers comprise fluorescent materials, and materials of the object sublayers of a part of the luminescent layers comprise phosphor materials;

- the subject sublayer is provided between the object sublayer of the phosphor materials and the object sublayer of the fluorescent materials, a first doped sublayer is provided between the object sublayer of the phosphor materials and the subject sublayer, and a second doped sublayer is provided between the object sublayer of the fluorescent materials and the subject sublayer;
- wherein a guest material of the first doped sublayer comprises the phosphor materials and a guest material of the second doped sublayer comprises the fluorescent materials.

In a light emitting device provided by an embodiment of the present application, materials of the object sublayers of a part of the luminescent layers comprise fluorescent materials, and materials of the object sublayers of a part of the luminescent layers comprise phosphor materials;

- wherein a quantity of the object sublayers of the phosphor materials is greater than or equal to a quantity of the object sublayers of the fluorescent materials.

In a light emitting device provided by an embodiment of the present application, a total quantity of the subject sublayers is different from a total quantity of the object sublayers.

In a light emitting device provided by an embodiment of the present application, the total quantity of the subject sublayers is greater than the total quantity of the object sublayers, or the total quantity of the subject sublayers is less than the total quantity of the object sublayers.

In a light emitting device provided by an embodiment of the present application, a range of a total thickness of the plurality of luminescent layers comprises 100 Å-500 Å, a 1st subject sublayer is disposed close to the hole transport layer, and a thickness of the 1st subject sublayer is less than or equal to 1/10 of the total thickness of the plurality of luminescent layers.

In a light emitting device provided by an embodiment of the present application, materials of the subject sublayers are the same, and/or, materials of the object sublayers are the same.

In a second aspect, an embodiment of the present application provides a display substrate, including a plurality of light emitting devices as described in the first aspect, that are arranged in array.

In a display substrate provided by an embodiment of the present application, emitting colors of the plurality of light emitting devices are partially different, and each of the plurality of light emitting devices comprises a first light emitting device, a second light emitting device and a third light emitting device;

- wherein materials of the object sublayers of the first light emitting device and the second light emitting device comprise phosphor materials, materials of the object sublayers of the third light emitting device comprise fluorescent materials, a quantity of the object sublayers of the first light emitting device is greater than or equal to a quantity of the object sublayers of the third light emitting device, and a quantity of the object sublayers of the second light emitting device is greater than or equal to the quantity of the object sublayers of the third light emitting device.

In a display substrate provided by an embodiment of the present application, emitting colors of the plurality of light emitting devices are partially different, and each of the plurality of light emitting devices comprises a first light emitting device, a second light emitting device, a third light emitting device and a fourth light emitting device;

- wherein materials of the object sublayers of the first light emitting device and the second light emitting device comprise phosphor materials, materials of the object sublayers of the third light emitting device comprise fluorescent materials, materials of a part of the object sublayers of the fourth light emitting device comprise the fluorescent materials, and materials of a part of the object sublayers of the fourth light emitting device comprise the phosphor materials; and
- a quantity of the object sublayers of the first light emitting device and a quantity of the object sublayers of the second light emitting device are both greater than or equal to a quantity of the object sublayers of the fourth light emitting device, and the quantity of the object sublayers of the fourth light emitting device is greater than or equal to a quantity of the object sublayers of the third light emitting device.

In a display substrate provided by an embodiment of the present application, emitting colors of the plurality of light emitting devices are all the same, and in a same light emitting device, materials of a part of the object sublayers comprise fluorescent materials, and materials of a part of the object sublayers comprise phosphor materials.

In a third aspect, an embodiment of the present application provides a display device, comprising the display substrate as described in the second aspect.

The above description is merely a summary of the technical solutions of the present disclosure. In order to more clearly know the technological means of the present disclosure to enable the implementation according to the contents of the specification, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work. It should be noted that the proportions in the figures are only indicative and do not represent the actual proportions.

Figure 22:
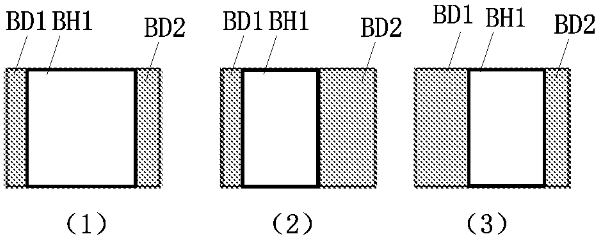
Figure 23:
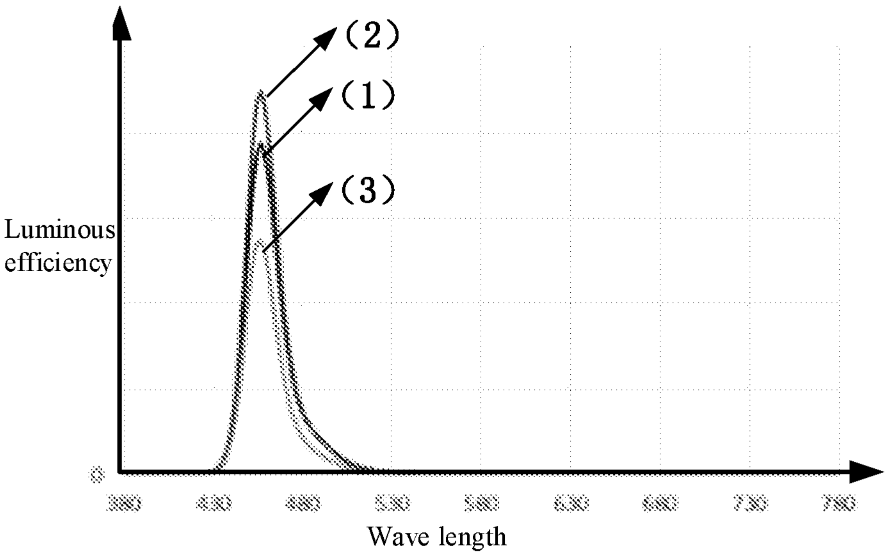
Figure 24:
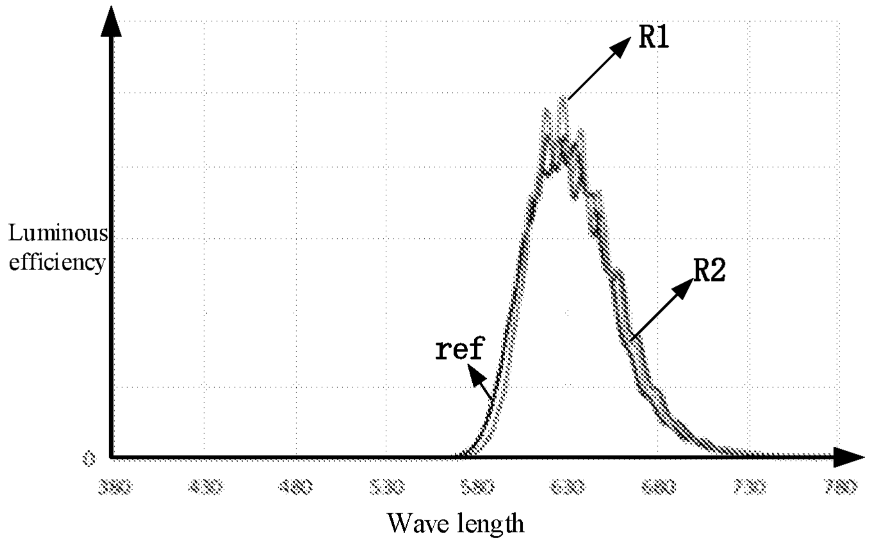
Figure 25:
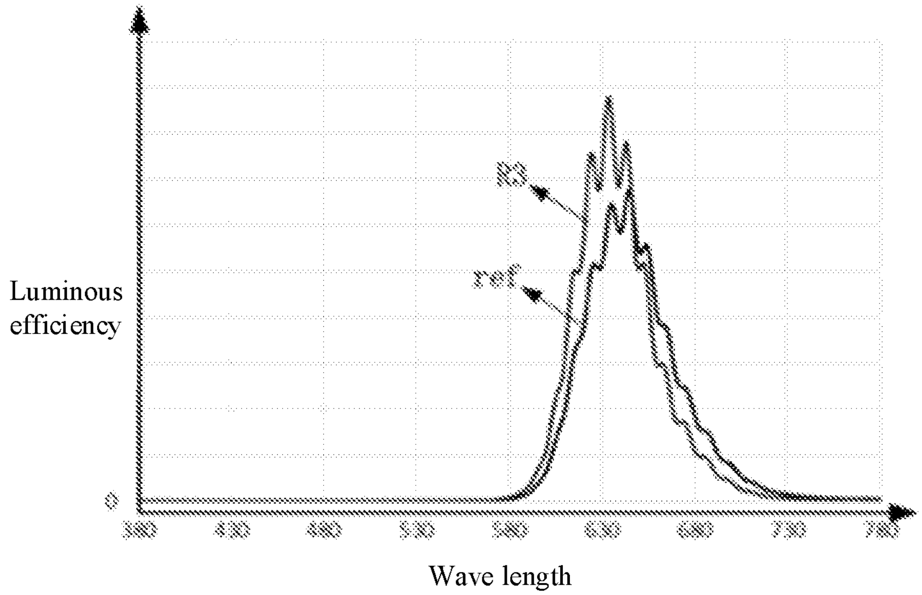
Figure 26:
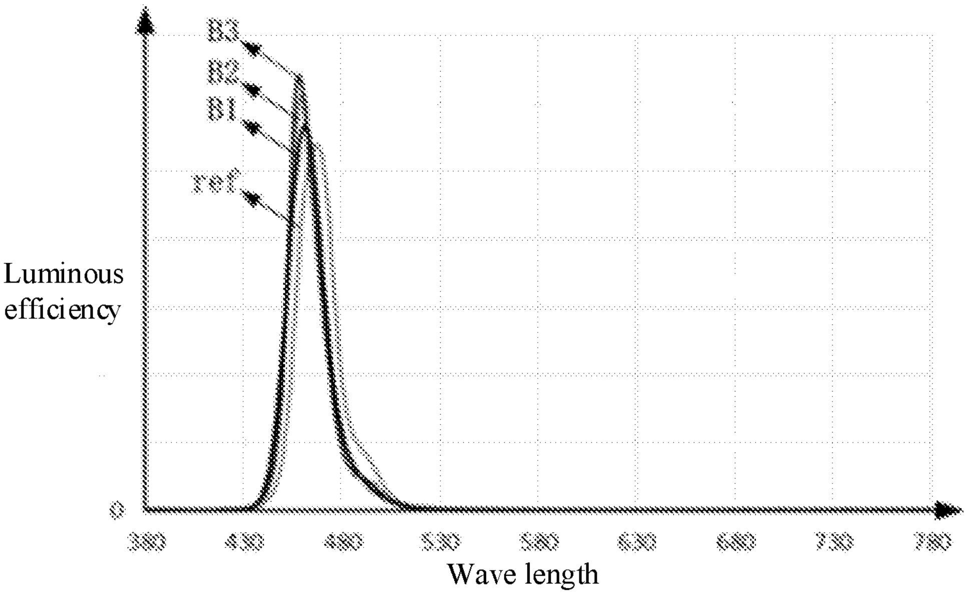
Figure 27:
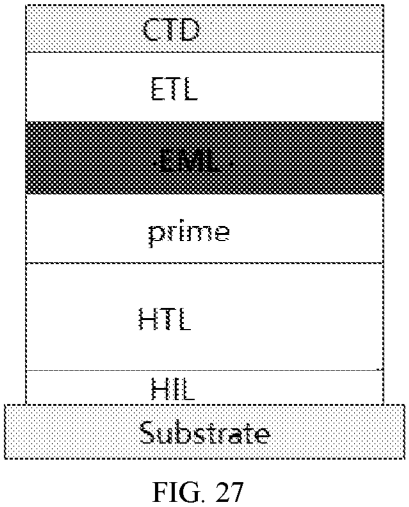
Figure 30:
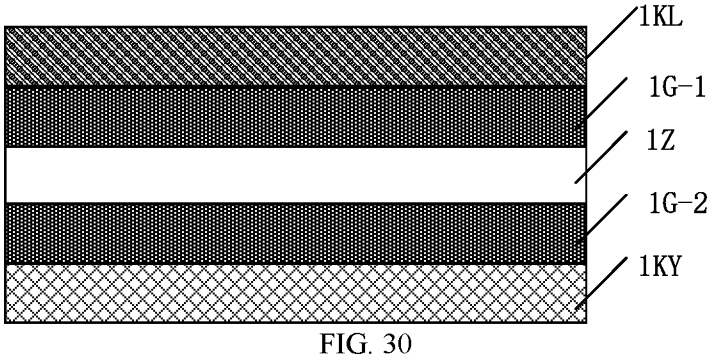
Figure 31:
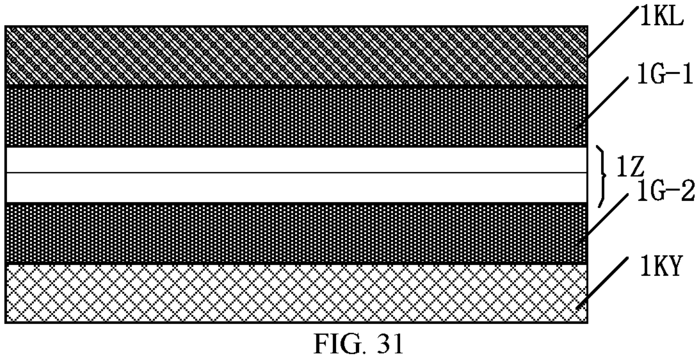
Figure 32:
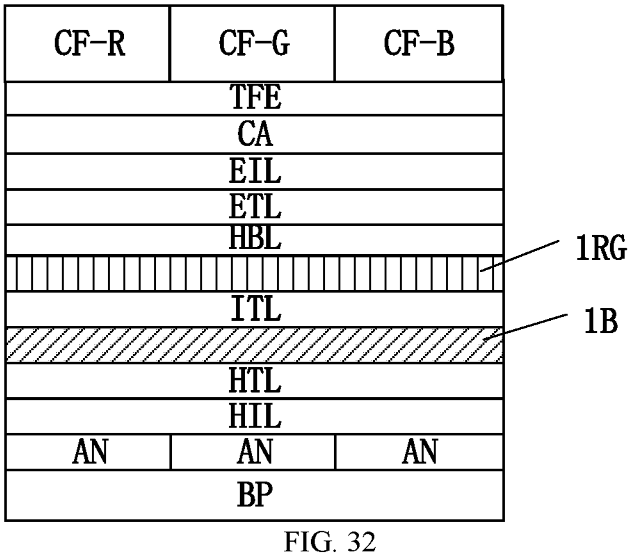
Figure 33:
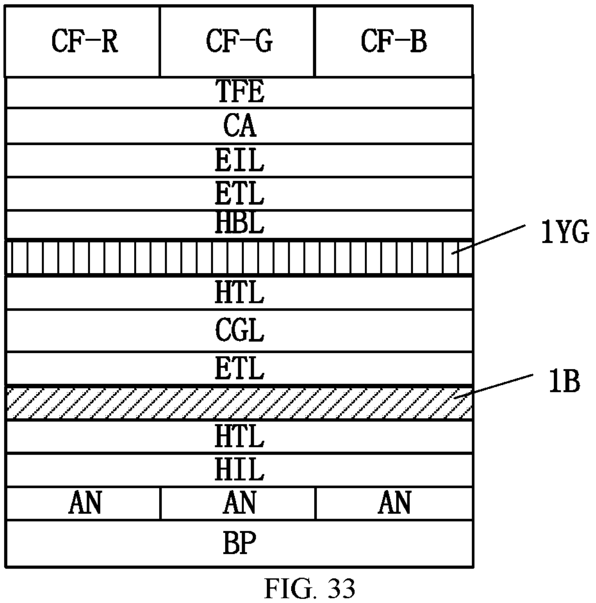

Plan (1), plan (2) and plan (3) in FIG. 22 are structural schematic diagrams of three types of light emitting devices with different distances from a geometric center of a luminescent layer to a hole transport layer according to embodiments of the present application;

FIG. 23 is a diagram of luminous efficiency comparison curves of plan (1), plan (2) and plan (3) in FIG. 22;

FIG. 24 is a diagram of luminous efficiency comparison curves of two types of red light emitting devices according to embodiments of the present application and a red light emitting device in related art;

FIG. 25 is a diagram of luminous efficiency comparison curves of another types of red light emitting device according to an embodiment of the present application and a red light emitting device in related art;

FIG. 26 is a diagram of luminous efficiency comparison curves of three types of blue light emitting devices according to embodiments of the present application and a blue light emitting device in related art;

FIG. 27 is a structural schematic diagram of a light emitting device in related art;

FIG. 28 to FIG. 31 are structural schematic diagrams of four types of light emitting devices including transition layers according to embodiments of the present application; and FIG. 32 and FIG. 33 are structural schematic diagrams of two types of display substrates according to embodiments of the present application.

DETAILED DESCRIPTION

The following will provide a clear and complete description of the technical solutions in the embodiments of the present disclosure in conjunction with the accompanying drawings. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Unless the context otherwise requires, in the entire specification and claims, the term "including" or "comprising" is interpreted as open and inclusive, meaning "including, but not limited to". In the description of the specification, the terms "one embodiment," "some embodiments," "exemplary embodiments," "examples," "specific examples," or "some examples," etc. are intended to indicate that specific features, structures, materials, or characteristics related to the embodiment or example are included in at least one embodiment or example of the present application. The schematic representation of the above terms may not necessarily refer to the same embodiment or example. In addition, the specific features, structures, materials, or features described may be included in any one or more embodiments or examples in any appropriate manner.

In addition, it should be noted that when introducing the elements and embodiments of the present application, the articles "a", "an", "the" and "said" are intended to indicate the existence of one or more elements. Unless otherwise specified, "a plurality of" means two or more; the terms "comprising", "including", "containing", and "having" are intended to include and indicate the existence of elements other than those listed; the terms "first", "second", "third", etc. are only used for descriptive purposes and cannot be understood as indicating or implying relative importance or order of formation.

The polygons in the specification are not strictly defined, but can be approximate triangles, rectangles, trapezoids, pentagons, or hexagons. They can have small deformations caused by tolerances, such as chamfers, fillets, arc edges, and deformations.

The thicknesses of the film layers provided in the specification refers to the average thickness. The actual thickness can fluctuate by 3%, 5%, or 10% based on the average thickness, and the fluctuation thickness range is also within the protection range of the present application.

With the continuous development of display technology, silicon-based Organic Light Emitting Diode (OLED) display products have the characteristics of small volume and high resolution. Its backplane is made using mature integrated circuit Complementary Metal Oxide Semiconductor (CMOS) technology, achieving the active addressing of pixels, including various circuits such as Timer Control Register (TCON) and Over Current Protection (OCP), which can achieve lightweight. The silicon-based OLED display products are widely used in the fields of near-to-eye displays, virtual reality (VR), augmented reality (AR), especially in AR/VR head mounted display devices.

One of the key technologies of the OLED devices is the doping of the host material and the guest material in the luminescent layer to form a luminous body. The host luminous body material (host material) with superior electron transport and luminescent properties can be combined with various high-performance guest luminous body materials (guest material) to obtain high-efficiency luminescent layers and light with various colors. Usually, the hierarchical design of the host material and the guest material, the matching of energy levels and interfaces of materials, can be used to separate the conductive function of charge carriers from their luminescent mechanisms, improve and optimize them respectively, with the ultimate goal of achieving the best conductive function and luminous efficiency for an OLED luminous body. In terms of conductivity, it is necessary to design a highly conjugated electron distribution structure with flat molecules, so that molecules can be effectively or even sequentially stacked to achieve optimal carrier transport and migration under a certain electric field. In terms of luminous efficiency, in order to make organic molecules to emit light in a solid state, it is best that there is no interaction or no easy stacking correlation between molecules, otherwise it will lead to energy conversion and fluorescence quenching at high concentrations. These two requirements are exactly opposite in terms of the design of organic molecules. The doping luminous body of OLED is a solution to the dilemma of designing the organic molecules, which is also one of the key factors for the productization of small molecule OLED panel technology in a short period of time. Another advantage of the doping luminous body of OLED is that the excitons generated by electrical excitation can be transferred to high fluorescence efficiency and higher stability dopants to emit light, thus improving the operational stability of the device. Therefore, the probability of non-luminescent energy decay in the device is minimized. Currently, this type of doping theory has successfully extended from fluorescent materials to phosphor materials and devices thereof.

Figure 1:
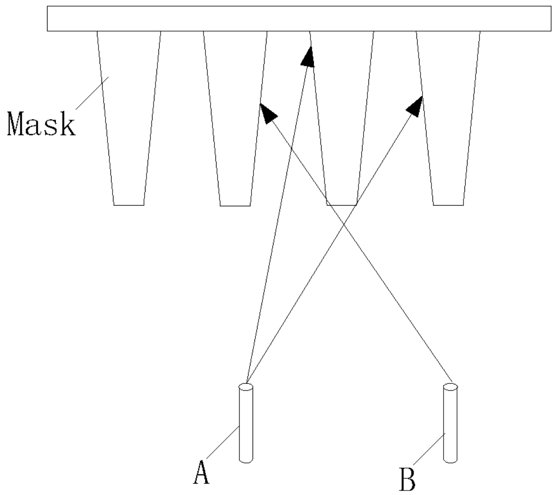
FIG. 1 is a schematic diagram of an evaporation process in related art.

At present, the silicon-based OLED display products mainly use the color scheme technology of white light OLED devices combined with color filters (CF). However, due to the display products have high light loss and power consumption after setting the color filters, the solution of directly forming color OLED devices on a silicon substrate has become a hot research topic. In practical applications, a silicon-based FMM (Fine Metal Mask) mask can be used to form a color OLED device. However, due to a thickness of the silicon-based FMM mask being approximately 20 μm, a thickness of the color OLED device is much smaller than that of the silicon-based FMM mask, as shown in FIG. 1. During the evaporation process, an evaporation source A of the host material and an evaporation source B of the guest material cannot be deposited simultaneously at the same position, resulting in delamination in local areas of the luminescent layer of the light emitting device. Therefore, the host material and the guest material cannot be uniformly doped together, resulting in quenching and reducing the luminous efficiency of the light emitting device.

For this purpose, an embodiment of the present application provides a newly designed light emitting device, display substrate, and display device. The light emitting device includes a plurality of luminescent layers, each of the luminescent layers includes at least one subject sublayer and at least one object sublayer, and the at least one subject sublayer and the at least one object sublayer are disposed alternately. Among them, thicknesses of at least a part of subject sublayers are greater than or equal to a thickness of the object sublayer. By reasonably setting the layered position and film thickness of the host material and the guest material in the luminescent layer, the efficiency and service life of the light emitting device in the silicon-based OLED display products can be improved.

The exemplary embodiments will now be described more comprehensively with reference to the accompanying drawings.

The embodiment of the present application provides a light emitting device, as shown in FIG. 2 to FIG. 16, the light emitting device includes:

- a plurality of luminescent layers 1, wherein each of the plurality of luminescent layers 1 includes at least one subject sublayer 1Z and at least one object sublayer 1K, and the at least one subject sublayer 1Z and the at least one object sublayer 1K are disposed alternately;
- wherein thicknesses of at least a part of subject sublayers 1Z are greater than or equal to a thickness of the object sublayer 1K.

There is no restriction on the emitting color of the light emitting device mentioned above. As an example, the emitting colors of the light emitting device are any one of red, green, blue, and white.

In exemplary embodiments, one luminescent layer 1 may include one subject sublayer 1Z and one object sublayer 1K. Alternatively, one luminescent layer 1 may include two subject sublayers 1Z and one object sublayer 1K. Alternatively, one luminescent layer 1 may include one subject sublayer 1Z and two object sublayers 1K.

There are no restrictions on the materials of the luminescent layers 1 in the above light emitting device.

For example, in the case that each luminescent layer 1 includes one subject sublayer 1Z and one object sublayer 1K, it may set the materials of some subject sublayers 1Z to be the same; or, it may set the materials of some object sublayers 1K to be the same; or, it may set the materials of some subject sublayers 1Z to be the same, and the materials of some object sublayers 1K to be the same; or, it may set the materials of all the subject sublayers 1Z to be the same; or, it may set the materials of all the object sublayers 1K to be the same; or, it may set the materials of all subject sublayers 1Z to be the same, and the materials of all object sublayers 1K to be the same.

For example, in the case that one luminescent layer 1 includes two subject sublayers 1Z and one object sublayer 1K, it may set the materials of the two subject sublayers 1Z to be the same; or, it may set the materials of the two subject sublayers 1Z to be partially the same; or, it may set the materials of the two subject sublayers 1Z to be completely different.

For example, in the case that one luminescent layer 1 includes one subject sublayer 1Z and two object sublayers 1K, it may set the materials of the two object sublayers 1K to be the same; or, it may set the materials of the two object sublayers 1K to be partially the same; or, it may set the materials of the two object sublayers 1K to be completely different.

In some embodiments, the material of the luminescent layer 1 may include fluorescent materials. In other embodiments, the material of the luminescent layer 1 may include phosphor materials.

For example, the material of the luminescent layer 1 may be selected from pyrene derivatives, anthracene derivatives, fluorene derivatives, perylene derivatives, styryl amine derivatives, metal complexes, etc.

For example, the material of the luminescent layer 1 may include the following compounds:

for example, blue luminescent materials

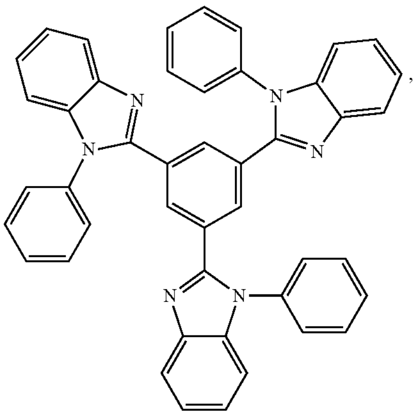

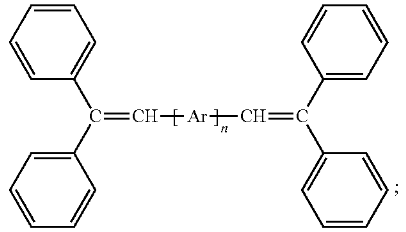

for example, green luminescent materials

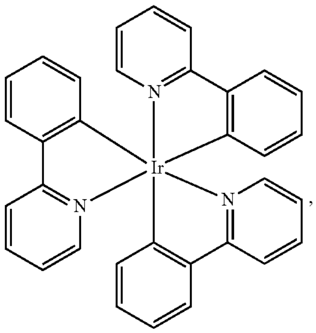

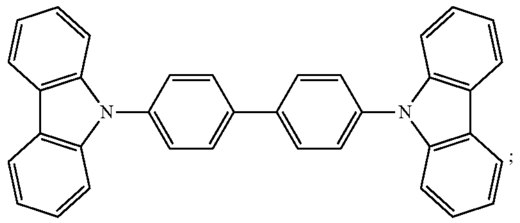

for example, red luminescent materials

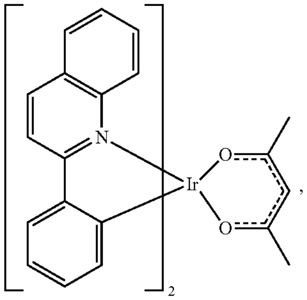

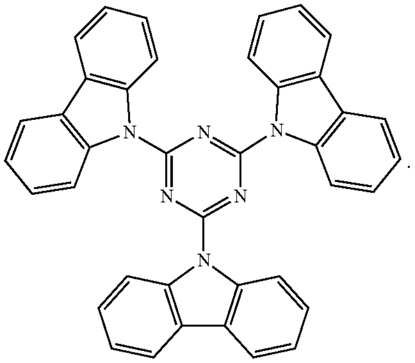

There is no restriction on a total number of layers of the plurality of luminescent layers 1. It can be understood that the above light emitting device includes at least two luminescent layers 1.

In an exemplary embodiment, a range of a total thickness of all luminescent layers 1 in the light emitting device may be 100 Å-500 Å. For example, the total thickness of all luminescent layers 1 in the light emitting device may be 150 Å, 200 Å, 250 Å, 300 Å, 400 Å, 450 Å.

There is no restriction on the thickness of one luminescent layer 1. When the total thickness of all luminescent layers 1 in the light emitting device is determined, the approximate thickness of the luminescent layer 1 is determined based on its number of layers.

There is no restriction on whether the thickness of each luminescent layer 1 in the above light emitting device is the same. In some embodiments, the thickness of each luminescent layer 1 is the same. In other embodiments, the thicknesses of some luminescent layers 1 are the same, while the thicknesses of some luminescent layers 1 are different.

Among them, thicknesses of at least a part of subject sublayers 1Z are greater than or equal to a thickness of the object sublayer 1K, including but not limited to the following situations:

firstly, the thicknesses of some subject sublayers 1Z are greater than or equal to the thickness of the object sublayer 1K, and the thicknesses of some subject sublayers 1Z are less than the thickness of the object sublayer 1K.

Secondly, the thicknesses of all subject sublayers 1Z are greater than or equal to the thickness of the object sublayer 1K.

There is no restriction on the relationship of the thicknesses of the object sublayers 1K in the light emitting device here. In some embodiments, it may set the thickness of each object sublayer 1K to be the same. In some embodiments, it may set the thicknesses of some object sublayers 1K to be the same. In some embodiments, it may set the thickness of each object sublayer 1K to be different.

There is no restriction on the relationship of the thicknesses of the subject sublayers 1Z in the light emitting device mentioned above. In some embodiments, it may set the thickness of each subject sublayer 1Z to be the same. In some embodiments, it may set the thicknesses of some subject sublayers 1Z to be the same. In some embodiments, it may set the thickness of each subject sublayer 1Z to be different.

In exemplary embodiments, the thicknesses of the object sublayers 1K are less than or equal to 2 Å. In other embodiments, the thicknesses of the object sublayers 1K are less than or equal to 3 Å.

In exemplary embodiments, the thicknesses of the subject sublayers 1Z are less than or equal to 250 Å. For example, the thicknesses of some subject sublayers 1Z may be less than or equal to 50 Å, such as 0.4 Å, 0.5 Å, 1 Å, 2 Å; and the thicknesses of other subject sublayers 1Z may be greater than or equal to 100 Å and less than or equal to 250 Å, for example, 100 Å, 120 Å, 140 Å, 220 Å.

The embodiment of the present application provides a new light emitting device, and the light emitting device includes: a plurality of luminescent layers 1, wherein each of the plurality of luminescent layers 1 includes at least one subject sublayer 1Z and at least one object sublayer 1K, and the at least one subject sublayer 1Z and the at least one object sublayer 1K are disposed alternately; wherein thicknesses of at least a part of subject sublayers 1Z are greater than or equal to a thickness of the object sublayer 1K. The concentration quenching phenomenon of the luminescent layer 1 in the light emitting device is improved, the luminous efficiency is improved, and the service life of the device is extended. In addition, compared to light emitting devices in related art, the difficulty of the evaporation process for the light emitting devices is lower, and it may be prepared using existing processes and equipment, thereby improving a utilization rate of the equipment and reducing costs.

Figure 2:
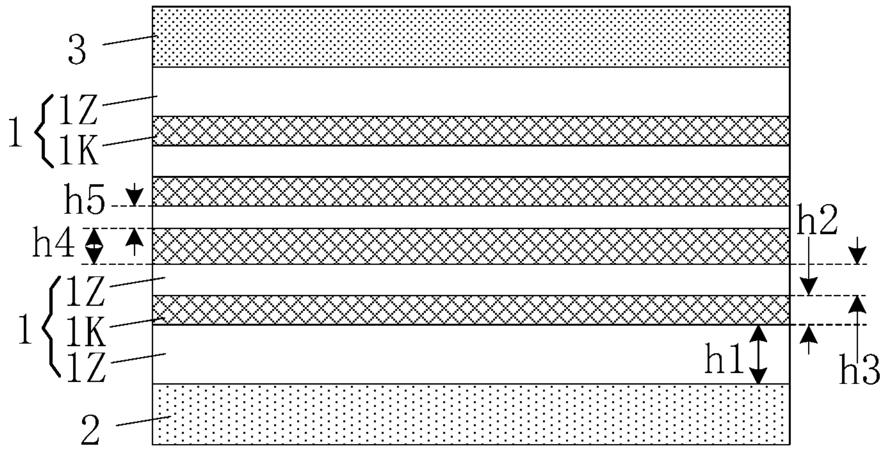
FIG. 2 is a structural schematic diagram of a first type of a light emitting device according to an embodiment of the present application.

In the light emitting device provided by the embodiment of the present application, as shown in FIG. 2, the light emitting device further includes a hole transport layer 2 and an electron transport layer 3, the plurality of luminescent layers 1 are located between the hole transport layer 2 and the electron transport layer 3; and an electron mobility of each subject sublayer 1Z gradually increases along a direction from the hole transport layer 2 pointing to the electron transport layer 3.

In exemplary embodiments, the material of the hole transport layer 2 may include aromatic amines with hole transport properties, as well as dimethyl fluorene or carbazole materials, such as: 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4-phenyl-4'-(9-phenylfluorene-9-yl)triphenylamine (BAFLP), 4,4'-bis[N-(9,9-dimethylfluoren-2-yl)-N-phenylamino]biphenyl (DFLDPBi), 4,4'-bis(9-carbazolyl)-1,1'-biphenyl (CBP), 9-phenyl-3-[4-(10-phenyl-9-anthracyl) phenyl]-9H-carbazole (PCzPA).

In exemplary embodiments, the material of the electron transport layer 3 may include aromatic heterocyclic compounds, such as benzimidazole derivatives, imidazole derivatives, pyrimidine derivatives, diazine derivatives, quinoline derivatives, isoquinoline derivatives, phenanthroline derivatives, and the like.

In exemplary embodiments, the light emitting device may further include a hole injection layer and an electron injection layer, wherein the hole injection layer is located on the side of the hole transport layer 2 away from the luminescent layer 1, and the electron injection layer is located on the side of the electron transport layer 3 away from the luminescent layer 1.

In exemplary embodiments, the material of the electron injection layer may be an alkali metal or a metal or its compounds, such as lithium fluoride (LiF), ytterbium (Yb), magnesium (Mg), and calcium (Ca).

In exemplary embodiments, the material of the hole injection layer may include oxides, such as oxides of molybdenum, titanium, vanadium, rhenium, ruthenium, chromium, zirconium, hafnium, tantalum, silver, tungsten, and manganese.

In exemplary embodiments, the material of the hole injection layer may also include organic materials, such as hexacyanohexaazatriphenylene, 2,3,5,6-tetrafluoro-7,7,8,8-tetracyano-p-quinodimethane (F4TCNQ), 1,2,3-tris [(cyan)(4-cyan-2,3,5,6-tetrafluorophenyl)methylene]cyclopropane.

In the light emitting device provided by the embodiment of the present application, by setting that the electron mobility of each subject sublayer 1Z gradually increases along a direction from the hole transport layer 2 pointing to the electron transport layer 3, that is, the closer the subject sublayer 1Z is to the electron transport layer 3, the greater the electron mobility of each subject sublayer 1Z. In this way, electrons in the subject sublayers 1Z located away from the hole transport layer 2 may migrate towards the direction close to the hole transport layer 2, thereby making the position where holes and the electrons form excitons (the recombination center of the excitons) closer to the hole transport layer 2. In addition, since the object sublayer 1K is located between the two subject sublayers 1Z, the emission centers of each object sublayer 1K are closer to the hole transport layer 2, it can greatly improve the luminous efficiency of the light emitting device.

In the light emitting device provided by the embodiment of the present application, as shown in FIG. 5 to FIG. 12, when a total quantity of the subject sublayers 1Z is N+1, that is, when the total quantity of the subject sublayers 1Z is an odd number, a minimum distance from a geometric center of a ((N/2)+1)th subject sublayer 1Z to the hole transport layer 2 is less than a minimum distance from the geometric center of the ((N/2)+1)th subject sublayer 1Z to the electron transport layer; wherein N is an even number.

The minimum distance refers to a distance along a thickness direction, or, a distance in a direction perpendicular to a plane on which the substrate of the light emitting device is located.

Figure 5:
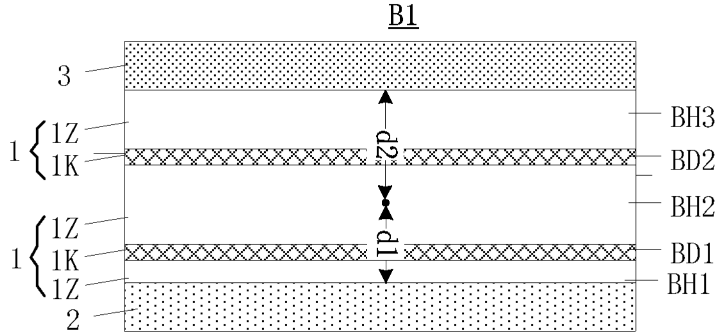
FIG. 5 to FIG. 13 are structural schematic diagrams of nine types of light emitting devices with subject sublayers and object sublayers disposed alternately according to embodiments of the present application.

In exemplary embodiments, referring to FIG. 5, when the total quantity of the subject sublayers 1Z is 3, a minimum distance d1 from a geometric center of a 2nd subject sublayer 1Z to the hole transport layer 2 is less than a minimum distance d2 from the geometric center of the 2nd subject sublayer 1Z to the electron transport layer 3.

Taking the light emitting device shown in FIG. 5 being a blue light emitting device (B1) as an example, the light emitting device includes a first subject sublayer BH1, a first object sublayer BD1, a second subject sublayer BH2, a second object sublayer BD2, a third subject sublayer BH3, and a third object sublayer BD3 that are arranged in sequence. Among them, the minimum distance d1 from the geometric center of the second subject sublayer BH2 to the hole transport layer 2 is less than the minimum distance d2 from the geometric center of the second subject sublayer BH2 to the electron transport layer 3.

For example, the structure of the light emitting device shown in FIG. 5 may also be a red light emitting device or a green light emitting device, the embodiments of the present application are labeled and illustrated by the light emitting device shown in FIG. 5 as the blue light emitting device. When the light emitting device shown in FIG. 5 is the blue light emitting device, the thicknesses of the first subject sublayer BH1, the first object sublayer BD1, the second subject sublayer BH2, the second object sublayer BD2, the third subject sublayer BH3, and the third object sublayer BD3 may be set as BH1(20 Å), BD1(2 Å), BH2 (110 Å), BD2(2 Å), BH3(65 Å), BD3(2 Å) in sequence.

Figure 6:
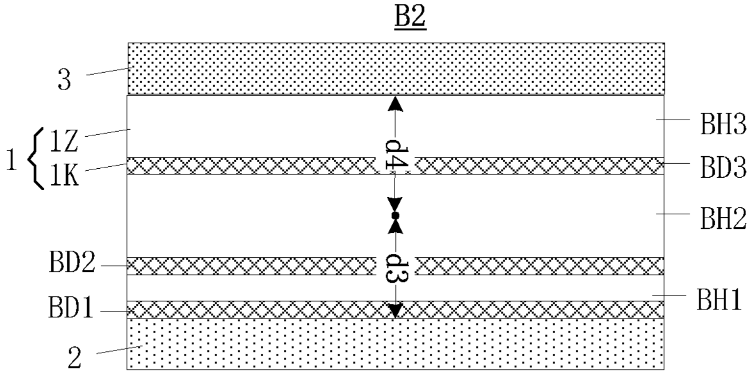

In exemplary embodiments, referring to FIG. 6, when the total quantity of the subject sublayers 1Z is 3, a minimum distance d3 from the geometric center of the 2nd subject sublayer 1Z to the hole transport layer 2 is less than a minimum distance d4 from the geometric center of the 2nd subject sublayer 1Z to the electron transport layer 3.

For example, when the light emitting device shown in FIG. 6 is the blue light emitting device (B2), the thicknesses of the first object sublayer BD1, the first subject sublayer BH1, the second object sublayer BD2, the second subject sublayer BH2, the third object sublayer BD3, and the third subject sublayer BH3 may be set as BDT(2 Å), BHT(20 Å), BD2(2 Å), BH2(110 Å), BD3(2 Å), BH3(65 Å) in sequence.

Figure 7:
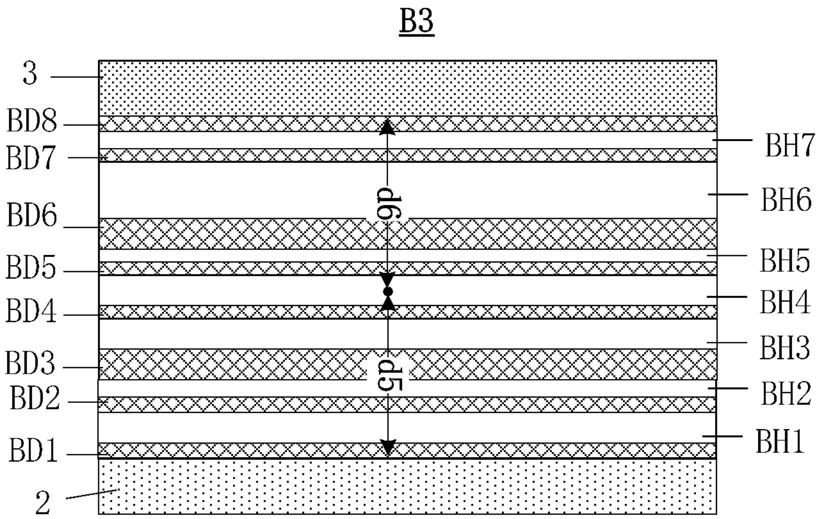

In exemplary embodiments, referring to FIG. 7, when the total quantity of the subject sublayers 1Z is 7, a minimum distance d5 from a geometric center of a 4th subject sublayer 1Z to the hole transport layer 2 is less than a minimum distance d6 from the geometric center of the 4th subject sublayer 1Z to the electron transport layer 3.

For example, when the light emitting device shown in FIG. 7 is the blue light emitting device (B3), the thicknesses of the first object sublayer BD1, the first subject sublayer BH1, the second object sublayer BD2, the second subject sublayer BH2, the third object sublayer BD3, the third subject sublayer BH3, a fourth object sublayer BD4, a fourth subject sublayer BH4, a fifth object sublayer BD5, a fifth subject sublayer BH5, a sixth object sublayer BD6, a sixth subject sublayer BH6, a seventh object sublayer BD7, a seventh subject sublayer BH7, and an eighth object sublayer BD8 may be set as BD1(0.4 Å), BH1(20 Å), BD2(0.4 Å), BH2(0.4 Å), BD3(20 Å), BH3(20 Å), BD4(0.4 Å), BH4(20 Å), BD5(0.4 Å), BH5(0.4 Å), BD6(20 Å), BH6(65 Å), BD7(0.4 Å), BH7(0.4 Å), BD8(0.4 Å) in sequence.

Figure 8:
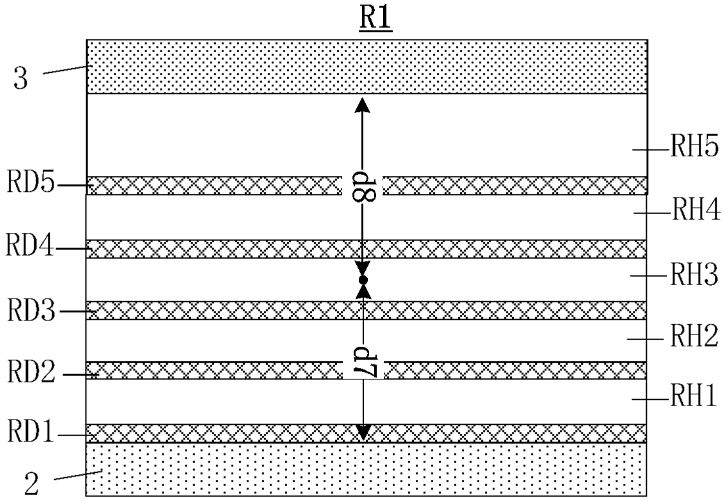

In exemplary embodiments, referring to FIG. 8, when the total quantity of the subject sublayers 1Z is 5, a minimum distance d7 from a geometric center of a 3rd subject sublayer 1Z to the hole transport layer 2 is less than a minimum distance d8 from the geometric center of the 3rd subject sublayer 1Z to the electron transport layer 3.

For example, when the light emitting device shown in FIG. 8 is a red light emitting device (R1), the thicknesses of the first object sublayer RD1, the first subject sublayer RH1, the second object sublayer RD2, the second subject sublayer RH2, the third object sublayer RD3, the third subject sublayer RH3, the fourth object sublayer RD4, the fourth subject sublayer RH4, the fifth object sublayer RD5, and the fifth subject sublayer RH5 may be set as RD1(0.7 Å), RH1(35 Å), RD2(0.7 Å), RH2(25 Å), RD3(0.7 Å), RH3(35 Å), RD4(0.7 Å), RH4(35 Å), RD5(0.7 Å), RH5(280 Å) in sequence.

Figure 9:
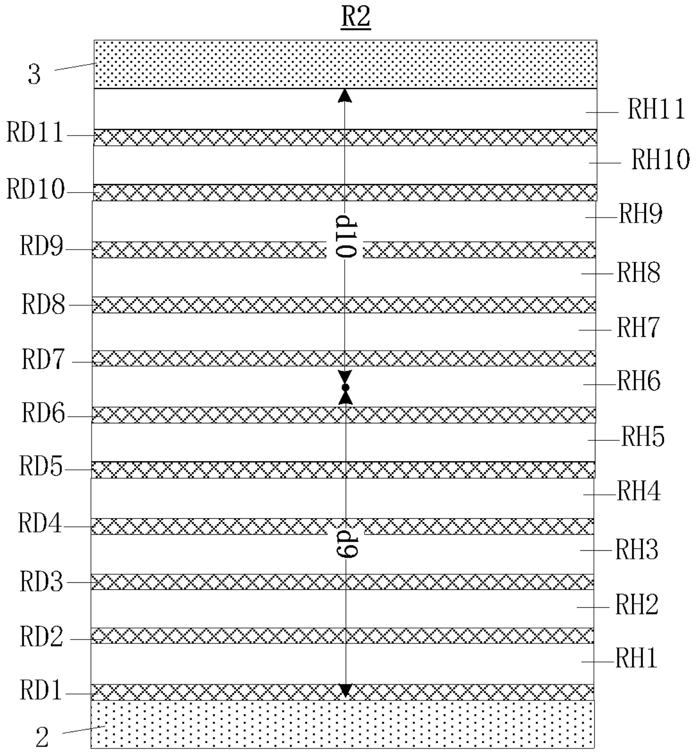

In exemplary embodiments, referring to FIG. 9, when the total quantity of the subject sublayers 1Z is 11, a minimum distance d9 from a geometric center of a 6th subject sublayer 1Z to the hole transport layer 2 is less than a minimum distance d10 from the geometric center of the 6th subject sublayer 1Z to the electron transport layer 3.

For example, when the light emitting device shown in FIG. 9 is the red light emitting device (R2), the thicknesses of the first object sublayer RD1, the first subject sublayer RH1, the second object sublayer RD2, the second subject sublayer RH2, the third object sublayer RD3, the third subject sublayer RH3, the fourth object sublayer RD4, the fourth subject sublayer RH4, the fifth object sublayer RD5, the fifth subject sublayer RH5, the sixth object sublayer RD6, the sixth subject sublayer RH6, the seventh object sublayer RD7, the seventh subject sublayer RH7, the eighth object sublayer RD8, an eighth subject sublayer RH8, a ninth object sublayer RD9, a ninth subject sublayer RH9, a tenth object sublayer RD10, a tenth subject sublayer RH10, an eleventh object sublayer RD11, and an eleventh subject sublayer RH11 may be set as RD1(0.7 Å), RH1(35 Å), RD2(0.7 Å), RH2(35 Å), RD3(0.7 Å), RH3(35 Å), RD4(0.7 Å), RH4(35 Å), RD5(0.7 Å), RH5(35 Å), RD6(0.7 Å), RH6(35 Å), RD7(0.7 Å), RH7(35 Å), RD8(0.7 Å), RH8(35 Å), RD9(0.7 Å), RH9(35 Å), RD10(0.7 Å), RH10(35 Å), RD11(0.7 Å), RH11(35 Å) in sequence.

Figure 10:
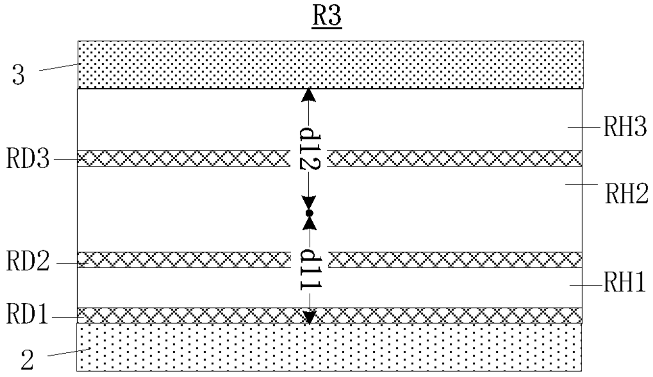

In exemplary embodiments, referring to FIG. 10, when the total quantity of the subject sublayers 1Z is 3, a minimum distance d11 from the geometric center of the 2nd subject sublayer 1Z to the hole transport layer 2 is less than a minimum distance d12 from the geometric center of the 2nd subject sublayer 1Z to the electron transport layer 3.

For example, when the light emitting device shown in FIG. 10 is the red light emitting device (R3), the thicknesses of the first object sublayer RD1, the first subject sublayer RH1, the second object sublayer RD2, the second subject sublayer RH2, the third object sublayer RD3, and the third subject sublayer RH3 may be set as RD1(4 Å), RH1(50 Å), RD2(4 Å), RH2(226 Å), RD3(4 Å), RH3(138 Å) in sequence.

Figure 11:
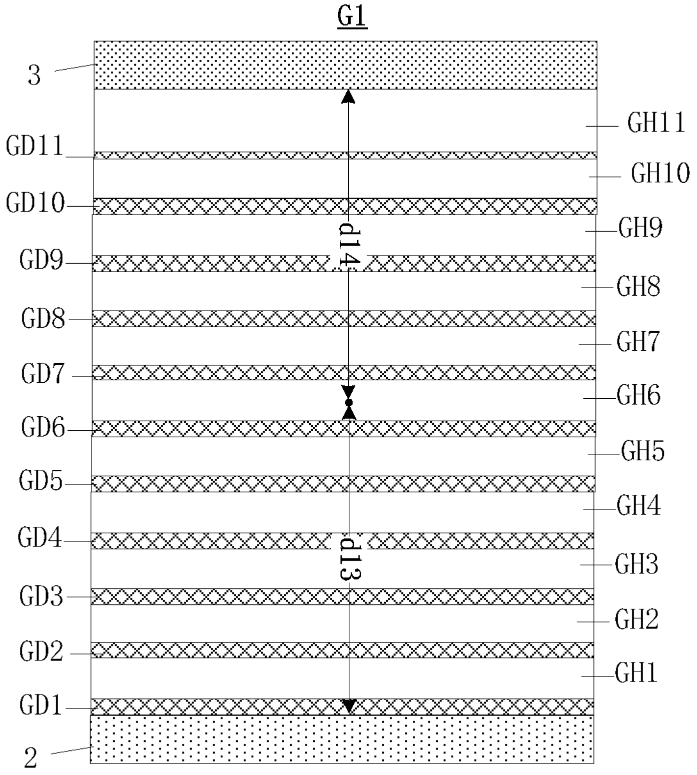

In exemplary embodiments, referring to FIG. 11, when the total quantity of the subject sublayers 1Z is 11, a minimum distance d13 from the geometric center of the 6th subject sublayer 1Z to the hole transport layer 2 is less than a minimum distance d14 from the geometric center of the 6th subject sublayer 1Z to the electron transport layer 3.

For example, when the light emitting device shown in FIG. 11 is a green light emitting device (G1), the thicknesses of the first object sublayer GD1, the first subject sublayer GH1, the second object sublayer GD2, the second subject sublayer GH2, the third object sublayer GD3, the third subject sublayer GH3, the fourth object sublayer GD4, the fourth subject sublayer GH4, the fifth object sublayer GD5, the fifth subject sublayer GH5, the sixth object sublayer GD6, the sixth subject sublayer GH6, the seventh object sublayer GD7, the seventh subject sublayer GH7, the eighth object sublayer GD8, the eighth subject sublayer GH8, the ninth object sublayer GD9, the ninth subject sublayer GH9, the tenth object sublayer GD10, the tenth subject sublayer GH10, the eleventh object sublayer GD11, and the eleventh subject sublayer GH11 may be set as GD1(3 Å), GH1(30 Å), GD2(3 Å), GH2(30 Å), GD3(3 Å), GH3(30 Å), GD4(3 Å), GH4(30 Å), GD5(3 Å), GH5(30 Å), GD6(3 Å), GH6(30 Å), GD7(3 Å), GH7(30 Å), GD8(3 Å), GH8(30 Å), GD9(3 Å), GH9(30 Å), GD10(3 Å), GH10(30 Å), GD11(0.7 Å), GH11 (35 Å) in sequence.

Figure 12:
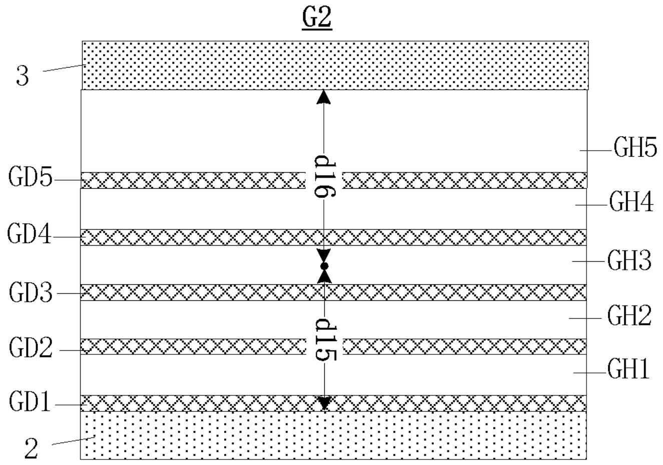

In exemplary embodiments, referring to FIG. 12, when the total quantity of the subject sublayers 1Z is 5, a minimum distance d15 from the geometric center of the 3rd subject sublayer 1Z to the hole transport layer 2 is less than a minimum distance d16 from the geometric center of the 3rd subject sublayer 1Z to the electron transport layer 3.

For example, when the light emitting device shown in FIG. 12 is the green light emitting device (G2), the thicknesses of the first object sublayer GD1, the first subject sublayer GH1, the second object sublayer GD2, the second subject sublayer GH2, the third object sublayer GD3, the third subject sublayer GH3, the fourth object sublayer GD4, the fourth subject sublayer GH4, the fifth object sublayer GD5, and the fifth subject sublayer GH5 may be set as GD1(3 Å), GH1(30 Å), GD2(3 Å), GH2(30 Å), GD3(3 Å), GH3(30 Å), GD4(3 Å), GH4(30 Å), GD5(3 Å), GH5(230 Å) in sequence.

It should be noted that the thickness of the film layer provided in the specification refers to an average thickness. The actual thickness can fluctuate by 3%, 5%, or 10% based on the average thickness, and the fluctuation thickness range is also within the protection range of the present application.

Figure 13:
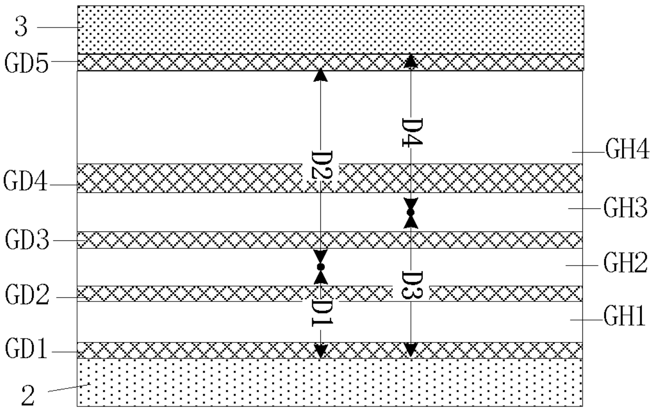
Figure 14:
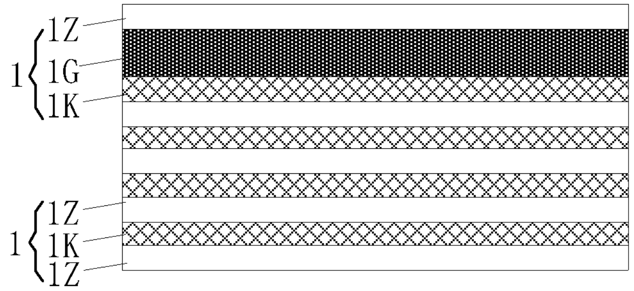
FIG. 14 to FIG. 21 are structural schematic diagrams of eight types of light emitting devices including doped sublayers according to embodiments of the present application.
Figure 15:
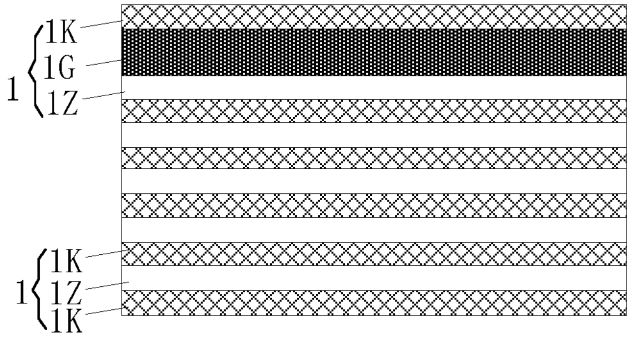
Figure 16:
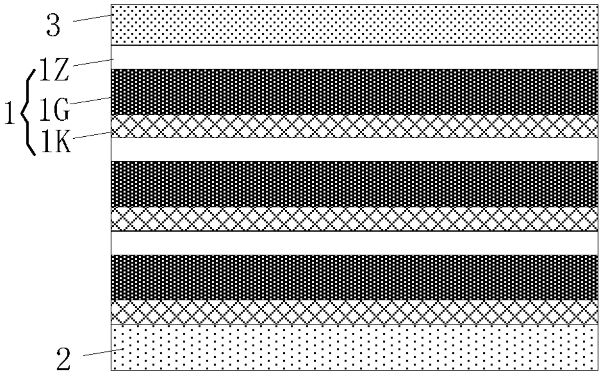
Figure 17:
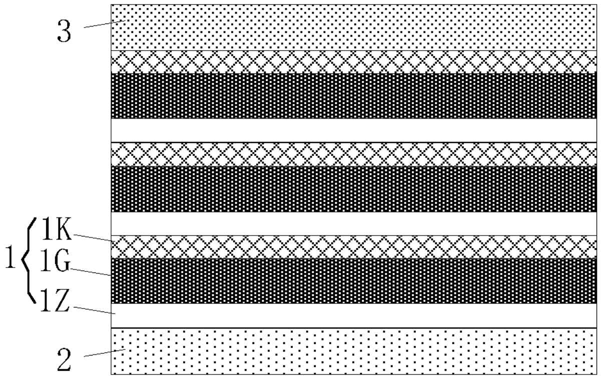
Figure 18:
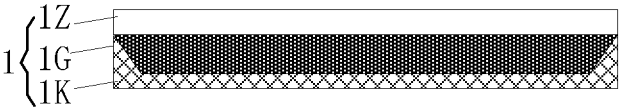
Figure 19:
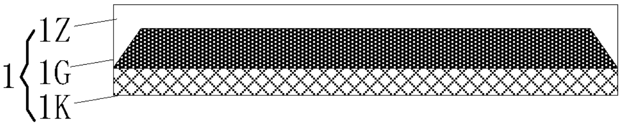

As shown in FIG. 13, when the total quantity of the subject sublayers is N, that is, when the total quantity of the subject sublayers 1Z is an even number, a minimum distance D1 from a geometric center of a (N/2)th subject sublayer 1Z to the hole transport layer 2 is less than a minimum distance D2 from the geometric center of the (N/2)th subject sublayer 1Z to the electron transport layer 3, and the minimum distance D3 from the geometric center of the ((N/2)+1)th subject sublayer 1Z to the hole transport layer 2 is less than the minimum distance D4 from the geometric center of the ((N/2)+1)th subject sublayer 1Z to the electron transport layer 3; wherein N is an even number.

Taking the light emitting device shown in FIG. 13 being the green light emitting device as an example, the light emitting device includes the first object sublayer GD1, the first subject sublayer GH1, the second object sublayer GD2, the second subject sublayer GH2, the third object sublayer GD3, the third subject sublayer GH3, the fourth object sublayer GD4, the fourth subject sublayer GH4, the fifth object sublayer GD5 that are arranged in sequence. Among them, the minimum distance D1 from a geometric center of the second subject sublayer GH2 to the hole transport layer 2 is less than the minimum distance D2 from the geometric center of the second subject sublayer GH2 to the electron transport layer 3, and the minimum distance D3 from the geometric center of the third subject sublayer GH3 to the hole transport layer 2 is less than the minimum distance D4 from the geometric center of the third subject sublayer GH3 to the electron transport layer 3.

For example, the structure of the light emitting device shown in FIG. 13 may also be the red light emitting device or the blue light emitting device, the embodiments of the present application are labeled and illustrated by the light emitting device shown in FIG. 13 as the green light emitting device.

In an embodiment of the present application, when setting that the electron mobility of each subject sublayer 1Z gradually increases along the direction from the hole transport layer 2 pointing to the electron transport layer 3, it further sets that when the total quantity of the subject sublayers 1Z is the odd number, the minimum distance from the geometric center of the ((N/2)+1)th subject sublayer 1Z to the hole transport layer 2 is less than the minimum distance from the geometric center of the ((N/2)+1)th subject sublayer 1Z to the electron transport layer; when the total quantity of the subject sublayers 1Z is an even number, the minimum distance D1 from the geometric center of the (N/2)th subject sublayer 1Z to the hole transport layer 2 is less than the minimum distance D2 from the geometric center of the (N/2)th subject sublayer 1Z to the electron transport layer 3, and the minimum distance D3 from the geometric center of the ((N/2)+1)th subject sublayer 1Z to the hole transport layer 2 is less than the minimum distance D4 from the geometric center of the ((N/2)+1)th subject sublayer 1Z to the electron transport layer 3. In this way, it may make the position where the holes and the electrons form the excitons (the recombination center of the excitons) closer to the hole transport layer 2. In addition, since the object sublayer 1K is located between the two subject sublayers 1Z, the emission centers of each object sublayer 1K are closer to the hole transport layer 2, it can greatly improve the luminous efficiency of the light emitting device.

In the light emitting device provided by the embodiment of the present application, as shown in FIG. 5 to FIG. 12, when the total quantity of the subject sublayers is N+1, a 1st subject sublayer 1Z is disposed close to the hole transport layer 2, a (N+1)th subject sublayer 1Z is disposed close to the electron transport layer 3, and a sum of thicknesses from the 1st subject sublayer 1Z to the (N/2)th subject sublayer 1Z is less than a sum of thicknesses from a ((N/2)+2)th subject sublayer 1Z to the (N+1)th subject sublayer 1Z; wherein N is an even number.

For example, as shown in FIG. 5 and FIG. 6, the total quantity of the subject sublayers 1Z is 3 (N=2), the light emitting device includes the first subject sublayer BH1, the second subject sublayer BH2, and the third subject sublayer BH3 that are arranged in sequence, the first subject sublayer BH1 is disposed close to the hole transport layer 2, the third subject sublayer BH3 is disposed close to the electron transport layer 3. Among them, the sum of the thicknesses from the 1st subject sublayer 1Z to the (N/2)th subject sublayer 1Z is a thickness of the first subject sublayer BH1, and the sum of the thicknesses from the ((N/2)+2)th subject sublayer 1Z to the (N+1)th subject sublayer 1Z is a thickness of the third subject sublayer BH3, that is the thickness of the first subject sublayer BH1 is less than the thickness of the third subject sublayer BH3.

For example, as shown in FIG. 7, the total quantity of the subject sublayers 1Z is 7 (N=6), the sum of the thicknesses from the 1st subject sublayer 1Z to the (N/2)th subject sublayer 1Z is a sum of thicknesses of the first subject sublayer BH1, the second object sublayer BD2, the second subject sublayer BH2, the third object sublayer BD3, and the third subject sublayer BH3, and the sum of the thicknesses from the ((N/2)+2)th subject sublayer 1Z to the (N+1)th subject sublayer 1Z is a sum of thicknesses of the fifth subject sublayer BH5, the sixth object sublayer BD6, the sixth subject sublayer BH6, the seventh object sublayer BD7, and the seventh subject sublayer BH7.

The situations in FIG. 8 to FIG. 12 are similar to the above situation and will not be repeated here.

In the embodiment of the present application, when setting that the electron mobility of each subject sublayer 1Z gradually increases along the direction from the hole transport layer 2 pointing to the electron transport layer 3, it further sets that when the total quantity of the subject sublayers 1Z is the odd number, the sum of thicknesses from the 1st subject sublayer 1Z to the (N/2)th subject sublayer 1Z is less than the sum of thicknesses from the ((N/2)+2)th subject sublayer 1Z to the (N+1)th subject sublayer 1Z. In this way, it may make the position where the holes and the electrons form the excitons (the recombination center of the excitons) closer to the hole transport layer 2. In addition, since the object sublayer 1K is located between the two subject sublayers 1Z, the emission centers of each object sublayer 1K are closer to the hole transport layer 2, it can greatly improve the luminous efficiency of the light emitting device.

In the light emitting device provided by the embodiment of the present application, as shown in FIG. 5 to FIG. 13, a ratio of a thickness of a subject sublayer 1Z with a minimum distance to the electron transport layer 3 being the least to a thickness of an object sublayer 1K with a minimum distance to the electron transport layer 3 being the least is a first value;

a ratio of a thickness of a subject sublayer 1Z with a minimum distance to the hole transport layer 2 being the least to a thickness of an object sublayer 1K with a minimum distance to the hole transport layer 2 being the least is a second value;

wherein the first value is greater than or equal to the second value.

For example, as shown in FIG. 8, the subject sublayer 1Z with the minimum distance to the electron transport layer 3 being the least is the fifth subject sublayer RH5, the object sublayer 1K with the minimum distance to the electron transport layer 3 being the least is the fifth object sublayer RD5, and the first value is a ratio of a thickness of the fifth subject sublayer RH5 to a thickness of the fifth object sublayer RD5. The subject sublayer 1Z with the minimum distance to the hole transport layer 2 being the least is the first subject sublayer RH1, the object sublayer 1K with the minimum distance to the hole transport layer 2 being the least is the first object sublayer RD1, and the second value is a ratio of a thickness of the first subject sublayer RH1 to a thickness of the first object sublayer RD1. The first value is greater than or equal to the second value, that is, the ratio of the thickness of the fifth subject sublayer RH5 to the thickness of the fifth object sublayer RD5 is greater than or equal to the ratio of the thickness of the first subject sublayer RH1 to the thickness of the first object sublayer RD1.

For example, in FIG. 8, the thicknesses of the first subject sublayer RH1, the first object sublayer RD1, the fifth subject sublayer RH5 and the fifth object sublayer RD5 are RH1(35 Å), RD1(0.7 Å), RH5(280 Å), RD5(0.7 Å), respectively. At this point, the first value is greater than the second value.

For example, as shown in FIG. 9, the subject sublayer 1Z with the minimum distance to the electron transport layer 3 being the least is the eleventh subject sublayer RH11, the object sublayer 1K with the minimum distance to the electron transport layer 3 being the least is the eleventh object sublayer RD11, and the first value is a ratio of a thickness of the eleventh subject sublayer RH11 to a thickness of the eleventh object sublayer RD11. The subject sublayer 1Z with the minimum distance to the hole transport layer 2 being the least is the first subject sublayer RH1, the object sublayer 1K with the minimum distance to the hole transport layer 2 being the least is the first object sublayer RD1, and the second value is the ratio of the thickness of the first subject sublayer RH1 to the thickness of the first object sublayer RD1. The first value is greater than or equal to the second value, that is, the ratio of the thickness of the eleventh subject sublayer RH 11 to the thickness of the eleventh object sublayer RD11 is greater than or equal to the ratio of the thickness of the first subject sublayer RH1 to the thickness of the first object sublayer RD1.

For example, in FIG. 9, the thicknesses of the first subject sublayer RH1, the first object sublayer RD1, the eleventh subject sublayer RH11 and the eleventh object sublayer RD11 are RH1(35 Å), RD1(0.7 Å), RH11(35 Å), RD11(0.7 Å), respectively. At this point, the first value is equal to the second value.

The situations in FIG. 5 to FIG. 7 and FIG. 10 to FIG. 13 are similar to the above situation, and will not be repeated here.

In the embodiment of the present application, it sets that the ratio of the thickness of the subject sublayer 1Z with the minimum distance to the electron transport layer 3 being the least to the thickness of the object sublayer 1K with the minimum distance to the electron transport layer 3 being the least is the first value; the ratio of the thickness of the subject sublayer 1Z with the minimum distance to the hole transport layer 2 being the least to the thickness of the object sublayer 1K with the minimum distance to the hole transport layer 2 being the least is the second value; wherein the first value is greater than or equal to the second value. In this way, it may make the position where the holes and the electrons form the excitons (the recombination center of the excitons) closer to the hole transport layer 2. In addition, since the object sublayer 1K is located between the two subject sublayers 1Z, the emission centers of each object sublayer 1K are closer to the hole transport layer 2, it can greatly improve the luminous efficiency of the light emitting device.

In the light emitting device provided by the embodiment of the present application, when the electron mobility of each subject sublayer 1Z gradually increases along the direction from the hole transport layer 2 pointing to the electron transport layer 3, by setting that the thicknesses of some subject sublayers 1Z on a side close to the electron transport layer 3 are greater than that of some subject sublayers 1Z on a side close to the hole transport layer 2, and the thicknesses of some subject sublayers 1Z on the side close to the hole transport layer 2 is less than or equal to 50 Å. Which may minimize the probability of high concentration quenching phenomenon and improve the luminous efficiency of the light emitting device.

In the light emitting device provided by the embodiment of the present application, as shown in FIG. 14 to FIG. 17, at least one of the luminescent layers 1 further includes a doped sublayer 1G, the doped sublayer 1G is located between the subject sublayer 1Z and the object sublayer 1K; and in a same luminescent layer 1, a thickness of the doped sublayer 1G is greater than or equal to at least one of a thickness of the subject sublayer 1Z and a thickness of the object sublayer 1K.

In exemplary embodiments, when the light emitting device includes the plurality of luminescent layers 1, the doped sublayer 1G may be provided in one luminescent layer 1, and other luminescent layers 1 may not be provided with the doped sublayers 1G. In some other embodiments, the plurality of luminescent layers 1 may all be provided with the doped sublayers 1G. The specific details can be determined based on the design of the light emitting device, and there are no restrictions here.

Sine in the same luminescent layer 1, the thickness of the subject sublayer 1Z is greater than or equal to the thickness of the object sublayer 1K, in the same luminescent layer 1, the thickness of the doped sublayer 1G is greater than or equal to at least one of the thickness of the subject sublayer 1Z and the thickness of the object sublayer 1K, including but not limited to the following situations:

1. the thickness of the doped sublayer 1G is greater than the thickness of the object sublayer 1K, and the thickness of the doped sublayer 1G is greater than the thickness of the subject sublayer 1Z;
2. the thickness of the doped sublayer 1G is greater than the thickness of the object sublayer 1K, and the thickness of the doped sublayer 1G is less than the thickness of the subject sublayer 1Z;
3. the thickness of the doped sublayer 1G is greater than the thickness of the object sublayer 1K, and the thickness of the doped sublayer 1G is equal to the thickness of the subject sublayer 1Z;

4. the thickness of the doped sublayer 1G is equal to the thickness of the object sublayer 1K, and the thickness of the doped sublayer 1G is less than the thickness of the subject sublayer 1Z;
5. the thickness of the doped sublayer 1G is equal to the thickness of the object sublayer 1K, and the thickness of the doped sublayer 1G is equal to the thickness of the subject sublayer 1Z.

In the light emitting device provided by the embodiment of the present application, each of the luminescent layers 1 includes the doped sublayer 1G, in the same luminescent layer 1, the thickness of the doped sublayer 1G is greater than or equal to a sum of the thickness of the subject sublayer 1Z and the thickness of the object sublayer 1K.

For example, the thickness of the doped sublayer 1G is greater than the sum of the thickness of the subject sublayer 1Z and the thickness of the object sublayer 1K. For another example, the thickness of the doped sublayer 1G is equal to the sum of the thickness of the subject sublayer 1Z and the thickness of the object sublayer 1K.

In the light emitting device provided by the embodiment of the present application, as shown in FIG. 18 to FIG. 21, each of the luminescent layers 1 includes a middle area and an edge area surrounding the middle area, a thickness of a part of the doped sublayer 1G located in the middle area is greater than a thickness of a part of the doped sublayer 1G located in the edge area; and a thickness of a part of the subject sublayer 1Z located in the middle area is less than a thickness of a part of the subject sublayer 1Z located in the edge area, and/or, a thickness of a part of the object sublayer 1K located in the middle area is less than a thickness of a part of the object sublayer 1K located in the edge area.

In exemplary embodiments, the luminescent layer 1 includes the middle area and the edge area surrounding the middle area, the thickness of the part of the doped sublayer 1G located in the middle area is greater than the thickness of the part of the doped sublayer 1G located in the edge area, and the thickness of the part of the subject sublayer 1Z located in the middle area is less than the thickness of the part of the subject sublayer 1Z located in the edge area.

In exemplary embodiments, the luminescent layer 1 includes the middle area and the edge area surrounding the middle area, the thickness of the part of the doped sublayer 1G located in the middle area is greater than the thickness of the part of the doped sublayer 1G located in the edge area, and the thickness of the part of the object sublayer 1K located in the middle area is less than the thickness of the part of the object sublayer 1K located in the edge area.

In exemplary embodiments, the luminescent layer 1 includes the middle area and the edge area surrounding the middle area, the thickness of the part of the doped sublayer 1G located in the middle area is greater than the thickness of the part of the doped sublayer 1G located in the edge area, the thickness of the part of the subject sublayer 1Z located in the middle area is less than the thickness of the part of the subject sublayer 1Z located in the edge area, and the thickness of the part of the object sublayer 1K located in the middle area is less than the thickness of the part of the object sublayer 1K located in the edge area.

There is no restriction on the size and shape of a middle area of the doped sublayer 1G here.

As an example, the size of the middle area of the doped sublayer 1G accounts for 60%-95% of the overall size of the doped sublayer 1G. For example, the size of the middle area of the doped sublayer 1G accounts for 70%, 75%, 80%, 85%, and 90% of the overall size of the doped sublayer 1G.

In addition, the size of an edge area of the doped sublayer 1G may be determined based on the size of the middle area of the doped sublayer 1G.

For example, the shape of the middle area of the doped sublayer 1G may include polygons, arcs, and combinations of the polygons and the arcs.

For example, the polygons may include a triangle, a quadrilateral, a pentagons, etc., while the arcs may include a circle, an ellipse, a semicircle, a semi ellipse, an arc, etc.; the combinations of the polygons and the arcs may include graphs formed by splicing the polygons and the arcs, or graphs formed by removing some areas from the polygons and the arcs.

For example, the shape of the edge area of the doped sublayer 1G is annulus, where the shape formed by the inner contour of the annulus may be determined based on the shape of the middle area of the doped sublayer 1G, and the shape of the outer contour of the annulus may be determined based on the shape of the outer contour of the luminescent layer 1.

The shape of the outer contour of the luminescent layer 1 may be determined based on pixel design. For example, the shape of the outer contour of the luminescent layer 1 may include a rectangle, a diamond, a circle, a column, and the like.

Figure 20:
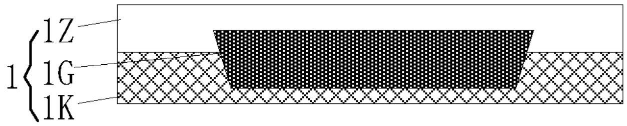
Figure 21:
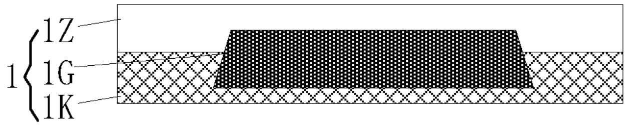

In the light emitting device provided by the embodiment of the present application, as shown in FIG. 20 and FIG. 21, the thickness of the part of the doped sublayer 1G located in the edge area is zero, and the part of the subject sublayer 1Z located in the edge area is in direct contact with the part of the object sublayer 1K located in the edge area.

In this way, in the doped sublayer 1G located in the middle area, the holes and the electrons are recombined to form the excitons, which can be transferred to the doped material in the doped sublayer 1G to emit light. In the area where the subject sublayer 1Z and the object sublayer 1K are in direct contact, the holes and the electrons are recombined on the side of the subject sublayer 1Z close to the object sublayer 1K to form the excitons, the excitons transfer towards the interface between the subject sublayer 1Z and the object sublayer 1K and emit light. The embodiment of the present application proposes a new structure of the light emitting device, and the structure setting greatly improves the luminous effect of the light emitting device.

In the light emitting device provided by the embodiment of the present application, materials of the doped sublayer 1G include at least one of a material of the subject sublayer 1Z and a material of the object sublayer 1K.

In exemplary embodiments, the material of the subject sublayer 1Z includes a host material (Host), the material of the object sublayer 1K includes a guest material (Dopant), and the materials of the doped sublayer 1G include the host material (Host) and the guest material (Dopant).

The materials of the doped sublayer 1G include at least one of the material of the subject sublayer 1Z and the material of the object sublayer 1K, including but not limited to the following situations:

firstly, the host material (Host) of the materials of the doped sublayer 1G is at least partially the same as the host material (Host) of the subject sublayer 1Z;

secondly, the guest material (Dopant) of the materials of the doped sublayer 1G is at least partially the same as the guest material (Dopant) of the object sublayer 1K;

thirdly, the host material (Host) of the materials of the doped sublayer 1G is at least partially the same as the host material (Host) of the subject sublayer 1Z, and the guest material (Dopant) of the materials of the doped sublayer 1G is at least partially the same as the guest material (Dopant) of the object sublayer 1K.

Among them, the meaning of "at least partially the same" mentioned above is: partially the same, or completely the same.

In the light emitting device provided by the embodiment of the present application, in order to reduce the difficulty of the preparation process and reduce costs, it may set that the materials of the doped sublayer 1G include the host material (Host) and the guest material (Dopant), the host material (Host) of the materials of the doped sublayer 1G is the same as the material of the subject sublayer 1Z, and the guest material (Dopant) of the materials of the doped sublayer 1G is the same as the material of the object sublayer 1K.

There is no restriction on the types of the host material mentioned above. In some embodiments, the host material may be an electronic-type host material, while in other embodiments, the host material may be a hole-type host material. In some other embodiments, the host material may be a bipolar host material.

For example, the bipolar host material may include CBP, BCP, mCP, and the like.

There is no restriction on the types of the guest material mentioned above. For example, the guest material may include $Ir(piq)_2acac$, $Ir(ppy)_3$, iridium(Ir), platinum(Pt), ruthenium(Ru), osmium(OS), rhenium(Re), and other materials.

In some embodiments, the guest material may include fluorescent materials. In other embodiments, the guest material may include phosphor materials. In some other embodiments, the guest material may include the fluorescent materials and the phosphor materials at the same time.

It should be noted that, the guest material may include the fluorescent materials and the phosphor materials at the same time, including but not limited to the following situations:

firstly, in the same luminescent layer 1, the material of one object sublayer 1K includes the fluorescent materials, and the material of another object sublayer 1K includes the phosphor materials;

secondly, in the same light emitting device, the material of the object sublayer 1K in one luminescent layer 1 includes the fluorescent materials, and the material of the object sublayer 1K in another luminescent layer 1 includes the phosphor materials;

thirdly, in the same luminescent layer 1, the material of one object sublayer 1K includes the fluorescent materials and the phosphor materials.

It should be noted that in the case that the material of the object sublayer 1K includes the phosphor materials, the luminescent mechanism of the phosphor materials is as follows:

the first type is that: after being excited, the holes and the electrons will form the excitons in the host material, the energy levels of the excitons here include the energy level S1 of singlet state excitons and the energy level T1 of triplet state excitons. The singlet state excitons of the S1 energy level are transferred from the host material through Foster energy transfer to the guest material, while the triplet state excitons of T1 energy level are transferred from the host material through Dexter energy transfer to the guest material. Then, phosphorescence is emitted through the radiation transition of the guest material, thereby achieving the luminescence of the light emitting device. At this point, it is required that the host material is doped with the guest material, otherwise the quenching phenomenon will be severe and the luminous efficiency will be very low.

The second type is that: the guest material is excited to emit light by capturing charge carriers. In this case, the excited electrons and holes are directly recombined to form the excitons on the guest material, and emit phosphorescence in the guest material. This luminescent mechanism occurs when the guest material is doped in the host material with a large energy gap, so that the electrons and the holes are not easily injected into the host material, but directly injected into the guest material and emit light. In the light emitting device provided by the embodiment of the present application, the luminescent layer 1 includes at least one subject sublayer 1Z and at least one object sublayer 1K, the subject sublayers 1Z and the object sublayers 1K are arranged alternately. Due to the thin thickness of the subject sublayer 1Z and the object sublayer 1K, especially the thin thickness of the object sublayer 1K, the subject sublayers 1Z and the object sublayers 1K that are arranged alternately are similar to doping the two, and the luminescent mechanism at this time is to excite the guest material to emit light by capturing the charge carriers.

It should be noted that, in the light emitting device provided by the embodiment of the present application, in the case that the material of the object sublayer 1K includes the phosphor materials, under the first type of the luminescent mechanism mentioned above, the subject sublayers 1Z and the object sublayers 1K that are arranged alternately will have a severe quenching phenomenon, therefore, it is required that a LUMO energy level of the material of the subject sublayer 1Z is greater than a LUMO energy level of the material of the object sublayer 1K, and a HOMO energy level of the material of the object sublayer 1K is greater than a HOMO energy level of the material of the subject sublayer 1Z; wherein the LUMO energy level is an energy level of a lowest unoccupied molecular orbital, and the HOMO energy level is an energy level of a highest occupied molecular orbital. That is, $LUMO_{1Z}>LUMO_{1K}$, and $HOMO_{1Z}<HOMO_{1K}$. At this point, the subject sublayers 1Z and the object sublayers 1K that are arranged alternately and provided by the embodiment of the present application are similar to doping the two, and mainly use the second type of luminescent mechanism mentioned above to emit light, that is, after being excited, the electrons and the holes are directly recombined to form the excitons on the guest material (object sublayer 1K), and emit phosphorescence in the guest material (object sublayer 1K).

In the light emitting device provided by the embodiment of the present application, the material of the object sublayer 1K includes the phosphor materials, the thickness of the object sublayer 1K is less than or equal to 3 Å, and the thickness of the subject sublayer 1Z is less than or equal to 300 Å.

In the embodiment of the present application, in the light emitting device of the phosphor materials, the excited electrons and holes are directly recombined to form the excitons on the guest material, and emit phosphorescence in the guest material. It should be noted that, the recombination center of the holes and the electrons is located in the object sublayer 1K, and the emission center of the excitons is also located in the object sublayer 1K. To improve the luminescence stability of the light emitting device and minimize the probability of exciton high concentration quenching, a plurality of object sublayers 1K are set, and the thickness of a single-layer object sublayer 1K is set to be less than or equal to 3 Å, to avoid the formation of too many excitons causing quenching due to the thickness of the single-layer object sublayer 1K is too thick. In addition, the plurality of object sublayers 1K are separated by the subject sublayer 1Z, and the luminous efficiency of the light emitting device is adjusted by adjusting the thickness of the subject sublayer 1Z.

In exemplary embodiments, the thickness of the object sublayers 1K may be 0.4 Å, 0.5 Å, 0.6 Å, 0.7 Å, 0.8 Å, 1 Å, 1.2 Å, 1.4 Å, 1.5 Å, 1.8 Å, 2 Å, 2.2 Å, 2.4 Å, 2.5 Å, 2.6 Å, 2.8 Å, 2.9 Å.

In exemplary embodiments, the thickness of the subject sublayers 1Z may be 0.4 Å, 0.7 Å, 1 Å, 20 Å, 30 Å, 35 Å, 50 Å, 65 Å, 75 Å, 100 Å, 120 Å, 135 Å, 225 Å, 250 Å, 280 Å, 300 Å.

In the light emitting device provided by the embodiment of the present application, the material of the object sublayer 1K includes the fluorescent materials, the thickness of the object sublayer 1K is less than or equal to 2 Å, and the thickness of the subject sublayer 1Z is less than or equal to 150 Å.

In the embodiment of the present application, in the light emitting device of the fluorescent materials, the excited electrons and holes are directly recombined to form the excitons on the host material (the subject sublayer 1Z) and transferred into the guest material (the object sublayer 1K). The recombination center of the holes and the electrons is located in the subject sublayer 1Z, and the emission center of the excitons is located in the object sublayer 1K. To improve the luminescence stability of the light emitting device and minimize the probability of exciton high concentration quenching, a plurality of object sublayers 1K are set, and the thickness of the single-layer object sublayer 1K is set to be less than or equal to 2 Å, to avoid gathering too many excitons causing quenching since the thickness of the single-layer object sublayer 1K is too thick. In addition, the plurality of object sublayers 1K are separated by the subject sublayer 1Z, and the luminous efficiency of the light emitting device is adjusted by adjusting the thickness of the subject sublayer 1Z.

In exemplary embodiments, the thickness of the object sublayers 1K may be 0.4 Å, 0.5 Å, 0.6 Å, 0.7 Å, 0.8 Å, 1 Å, 1.2 Å, 1.4 Å, 1.5 Å, 1.8 Å, 2 Å.

In exemplary embodiments, the thickness of the subject sublayers 1Z may be 0.4 Å, 0.7 Å, 1 Å, 20 Å, 30 Å, 35 Å, 50 Å, 65 Å, 75 Å, 100 Å, 120 Å, 135 Å, 145 Å.

It should be noted that the thickness of the film layer provided in the specification refers to an average thickness. The actual thickness can fluctuate by 3%, 5%, or 10% based on the average thickness, and the fluctuation thickness range is also within the protection range of the present application.

Figure 28:
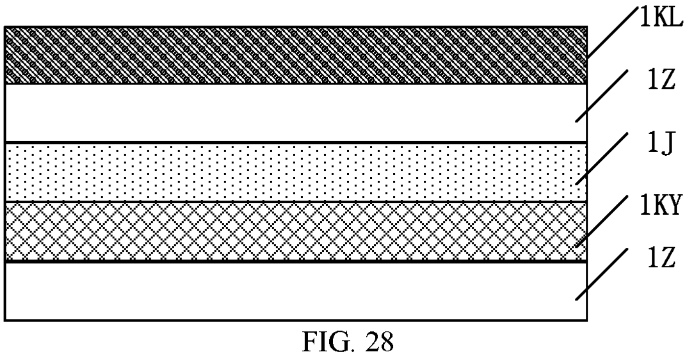
Figure 29:
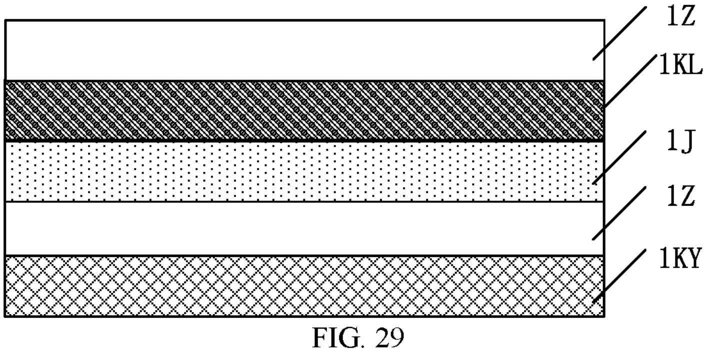

In the light emitting device provided by the embodiment of the present application, materials of the object sublayers 1K of a part of the luminescent layers 1 include fluorescent materials, and materials of the object sublayers 1K of a part of the luminescent layers 1 include phosphor materials;

as shown in FIG. 28 and FIG. 29, a transition layer 1J and the subject sublayer 1Z are provided between the object sublayer 1KL of the phosphor materials and the object sublayer 1KY of the fluorescent materials; and as shown in FIG. 29, the transition layer 1J is located between the subject sublayer 1Z and the object sublayer 1KL of the phosphor materials, or, as shown in FIG. 28, the transition layer 1J is located between the subject sublayer 1Z and the object sublayer 1KY of the fluorescent materials; wherein the transition layer 1J includes a spacer sublayer or a charge transport sublayer.

In exemplary embodiments, when the transition layer 1J includes the spacer sublayer, for example, in the light emitting device of a display substrate shown in FIG. 32, the spacer sublayer 1TL is located between the luminescent layer 1RG (the sublayers in the luminescent layer 1RG are not depicted in the figure, and the luminescent layer 1RG includes both red phosphor materials and green phosphor materials) and the luminescent layer 1B (the sublayers in the luminescent layer 1B are not depicted in the figure, and the luminescent layer 1B includes blue phosphor materials).

Among them, in some embodiments, the materials of the spacer sublayer (Interlayer) include materials with hole transmission characteristics. In other embodiments, the spacer sublayer includes a doped film layer with the materials with the hole transmission characteristics as the host and the phosphor materials or the fluorescent materials as the guest.

In exemplary embodiments, the charge transport sublayer includes a hole transport sublayer or an electron transport sublayer. At this point, the light emitting device is a light emitting device with Tandem design. The specific structure of the light emitting device of Tandem design may refer to related art, and will not be repeated here.

In exemplary embodiments, when the transition layer 1J includes the charge transport sublayer (CGL), for example, in the light emitting device of the display substrate shown in FIG. 33, the materials of each luminescent layer 1 located on one side of the charge transport sublayer include blue fluorescent materials, with an emitting color of blue (such as the luminescent layer 1B, where each sublayer in the luminescent layer 1B is not depicted in the figure). The materials of each luminescent layer 1 located on the other side of the charge transport sublayer include yellow phosphor materials and green phosphor materials (such as the luminescent layer TYG, where each sublayer in the luminescent layer TYG is not depicted in the figure), and the emitting color is yellow green. After mixing the colors of the light, the light emitted by the light emitting device is white.

Certainly, the light emitting device in the display substrate may also include a hole transport sublayer and an electron transport sublayer that are located between the luminescent layer 1B and the luminescent layer TYG, as well as an anode AN, a cathode CA, an encapsulation layer TFE, and the like.

There are no restrictions on the emitting colors of the phosphor materials and the fluorescent materials.

For example, as shown in FIG. 28 and FIG. 29, the material of the object sublayer 1KL of the phosphor materials includes the phosphor materials with the emitting color of red and the phosphor materials with the emitting color of green. The material of the object sublayer 1KY of the fluorescent materials includes the fluorescent materials with the emitting color of blue. At this point, the light emitting device includes three colors of luminescent materials: red, green, and blue. According to the principle of light mixing, the light emitted by the light emitting device is white.

In the embodiment of the present application, by setting a plurality of subject sublayers 1Z and a plurality of object sublayers 1K that are disposed alternately, the concentration quenching phenomenon of the luminescent layer 1 in the light emitting device is improved, the luminous efficiency is improved, and the service life of the device is extended. In addition, compared to light emitting devices in related art, the difficulty of the evaporation process for the light emitting devices is lower, and it may be prepared using existing processes and equipment, thereby improving a utilization rate of the equipment and reducing costs.

In the light emitting device provided by the embodiment of the present application, materials of the object sublayers 1K of a part of the luminescent layers 1 include fluorescent materials, and materials of the object sublayers 1K of a part of the luminescent layers 1 include phosphor materials;

as shown in FIG. 30 and FIG. 31, the subject sublayer 1Z is provided between the object sublayer 1KL of the phosphor materials and the object sublayer 1KY of the fluorescent materials, a first doped sublayer 1G-1 is provided between the object sublayer 1KL of the phosphor materials and the subject sublayer 1Z, and a second doped sublayer 1G-2 is provided between the object sublayer 1KY of the fluorescent materials and the subject sublayer 1Z;

wherein a guest material of the first doped sublayer 1G-1 includes the phosphor materials and a guest material of the second doped sublayer 1G-2 includes the fluorescent materials.

In exemplary embodiments, as shown in FIG. 30 and FIG. 31, the guest material of the first doped sublayer 1G-1 is the same as the material of the object sublayer 1KL of the phosphor materials, and the guest material of the second doped sublayer 1G-2 is the same as the material of the object sublayer 1KY of the fluorescent materials.

There is no restriction on the material of the subject sublayer 1Z in FIG. 30 and FIG. 31 above. As an example, the material of the subject sublayer 1Z, the host material of the first doped sublayer 1G-1, and the host material of the second doped sublayer 1G-2 are at least partially the same.

For example, the material of the subject sublayer 1Z is the same as the host material in the first doped sublayer 1G-1.

For example, the material of the subject sublayer 1Z is the same as the host material of the second doped sublayer 1G-2.

For another example, the material of the subject sublayer 1Z, the host material of the first doped sublayer 1G-1, and the host material of the second doped sublayer 1G-2 are all the same.

For yet another example, some of the materials of the subject sublayer 1Z are the same as the host materials of the first doped sublayer 1G-1, and some of the materials of the subject sublayer 1Z are the same as the host materials of the second doped sublayer 1G-2. At this point, as shown in FIG. 31, the subject sublayer 1Z may include two film layers. The material of the sublayer on the side close to the first doped sublayer 1G-1 is the same as the host material of the first doped sublayer 1G-1, and the material of the sublayer on the side close to the second doped sublayer 1G-2 is the same as the host material in the second doped sublayer 1G-2. In some embodiments, a spacer sublayer (Interlayer) may also be set between the two film layers of the subject sublayer 1Z.

In the embodiment of the present application, by setting a plurality of subject sublayers 1Z and a plurality of object sublayers 1K to be disposed alternately, and setting phosphorescent object sublayers and fluorescent object sublayers to be stacked, the concentration quenching phenomenon of the luminescent layer 1 in the light emitting device is improved, the luminous efficiency is improved, and the service life of the device is extended. In addition, compared to light emitting devices in related art, the difficulty of the evaporation process for the light emitting devices is lower, and it may be prepared using existing processes and equipment, thereby improving a utilization rate of the equipment and reducing costs.

In the light emitting device provided by the embodiment of the present application, materials of the object sublayers 1K of a part of the luminescent layers 1 include fluorescent materials, and materials of the object sublayers 1K of a part of the luminescent layers 1 include phosphor materials; wherein a quantity of the object sublayers 1KL of the phosphor materials is greater than or equal to a quantity of the object sublayers 1KY of the fluorescent materials.

In some embodiments, the quantity of the object sublayers 1KL of the phosphor materials is greater than the quantity of the object sublayers 1KY of the fluorescent materials. In other embodiments, the quantity of the object sublayers 1KL of the phosphor materials is equal to the quantity of the object sublayers 1KY of the fluorescent materials.

In the embodiment of the present application, the excited electrons and holes are directly recombined to form the excitons on the guest material, and emit phosphorescence in the guest material. It should be noted that, the recombination center of the holes and the electrons is located in the object sublayer 1K, and the emission center of the excitons is also located in the object sublayer 1K. By setting that the quantity of the object sublayers 1KL of the phosphor materials is greater than or equal to the quantity of the object sublayers 1KY of the fluorescent materials, it may further reduce the probability of phosphorescence quenching, improve the luminous efficiency of phosphorescence, and thereby improve the overall efficiency of the device.

Figure 3:
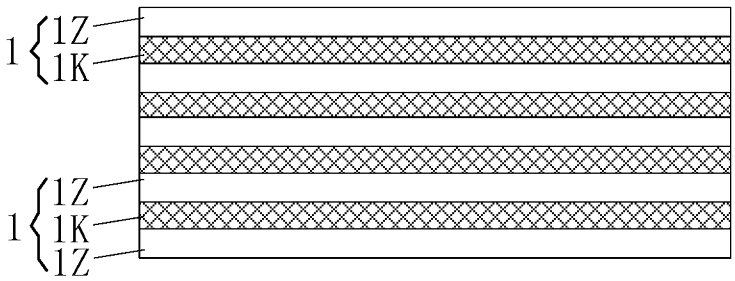
FIG. 3 and FIG. 4 are structural schematic diagrams of two types of light emitting devices with different quantities of subject sublayers and object sublayers according to embodiments of the present application.
Figure 4:
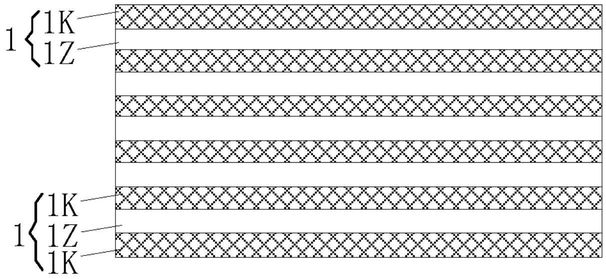

In the light emitting device provided by the embodiment of the present application, as shown in FIG. 3 or FIG. 4, a total quantity of the subject sublayers 1Z is different from a total quantity of the object sublayers 1K.

In the light emitting device provided by the embodiment of the present application, as shown in FIG. 3, the total quantity of the subject sublayers 1Z is greater than the total quantity of the object sublayers 1K, or, as shown in FIG. 4, the total quantity of the subject sublayers 1Z is less than the total quantity of the object sublayers 1K.

In the light emitting device provided by the embodiment of the present application, as shown in FIG. 5 to FIG. 12, a range of a total thickness of the plurality of luminescent layers 1 includes 100 Å~500 Å, a 1st subject sublayer 1Z is disposed close to the hole transport layer 2, and a thickness of the 1st subject sublayer 1Z is less than or equal to 1/10 of the total thickness of the plurality of luminescent layers 1.

It should be noted that, the 1st subject sublayer 1Z refers to the subject sublayer 1Z with a distance to the hole transport layer 2 being the least.

For example, the range of the total thickness of the luminescent layers 1 in the red light emitting device may be 100 Å-500 Å, and the ranges of the total thicknesses of the luminescent layers 1 in the blue light emitting device and the green light emitting device may be 100 Å-400 Å.

For example, the thickness of the 1st subject sublayer 1Z is less than or equal to 50 Å.

In exemplary embodiments, it may set that the thickness of the subject sublayer 1Z close to the electron transport layer 3 is greater than the thickness of the 1st subject sublayer 1Z. For example, it may set the thickness of the subject sublayer 1Z close to the electron transport layer 3 to be 30 Å, 35 Å, 50 Å, 65 Å, 100 Å, 225 Å.

In the embodiment of the present application, by setting the thickness of the subject sublayer 1Z with a distance to the hole transport layer 2 being the least to be less than or equal to 1/10 of the total thickness of the plurality of luminescent layers 1, the geometric center of each subject sublayer 1Z are close to one side of the hole transport layer 2. Since the object sublayer 1K is located between two adjacent subject sublayers 1Z, the geometric center of each object sublayer 1K are also close to one side of the hole transport layer 2, thus making the emission center of each object sublayer 1K close to one side of the hole transport layer 2, thereby improving the emission efficiency of the light emitting device.

In the light emitting device provided by the embodiment of the present application, materials of the subject sublayers 1Z are the same, and/or, materials of the object sublayers 1K are the same.

Among them, the materials of the subject sublayers 1Z are the same, and/or, the materials of the object sublayers 1K are the same, including the following situations:

- firstly, the materials of the subject sublayers 1Z are the same, and the materials of the object sublayers 1K are at least partially different;
- secondly, the materials of the object sublayers 1K are the same, and the materials of the subject sublayers 1Z are at least partially different;
- thirdly, the materials of the subject sublayers 1Z are the same, and the materials of the object sublayers 1K are the same.

To illustrate that the luminous efficiency of the light emitting device provided in the embodiment of the present application has indeed been improved, multiple sets of comparative test data are provided below for detailed explanation.

The embodiment of the present application provides three types of blue fluorescent light emitting devices, as shown in plan (1) in FIG. 22, plan (2) in FIG. 22, and plan (3) in FIG. 22. Each luminescent layer 1 includes a first object sublayer BD1, a first subject sublayer GH1, and a second object sublayer BD2 arranged sequentially on the hole transport layer 2.

Among them, the thicknesses of the first object sublayer BD1, the first subject sublayer GH1, and the second object sublayer BD2 of the first type of the blue fluorescent light emitting device shown in plan (1) in FIG. 22 are 10 Å, 180 Å, and 10 Å, respectively. The distance from the geometric center of the luminescent layer (which can be approximated as the recombination center of the excitons at this point) to the hole transport layer 2 is 100 Å.

The thicknesses of the first object sublayer BD1, the first subject sublayer GH1, and the second object sublayer BD2 of the second type of the blue fluorescent light emitting device shown in plan (2) in FIG. 22 are 10 Å, 100 Å, and 90 Å, respectively. The distance from the geometric center of the luminescent layer (which can be approximated as the recombination center of the excitons at this point) to the hole transport layer 2 is 60 Å.

The thicknesses of the first object sublayer BD1, the first subject sublayer GH1, and the second object sublayer BD2 of the third type of the blue fluorescent light emitting device shown in plan (3) in FIG. 22 are 90 Å, 100 Å, and 10 Å, respectively. The distance from the geometric center of the luminescent layer (which can be approximated as the recombination center of the excitons at this point) to the hole transport layer 2 is 95 Å.

Among them, the distance from the geometric center of the luminescent layer of the second type of the blue fluorescent light emitting device to the hole transport layer 2 is the least.

FIG. 23 provides a diagram of luminous efficiency curves of the above three types of the light emitting devices, it can be seen that the luminous efficiency of the second type of the blue fluorescent light emitting device is the highest.

FIG. 24 and FIG. 25 provide diagrams of luminous efficiency comparison curves of a red phosphorescent light emitting device (ref) in related art and three types of red phosphorescent light emitting devices of R1, R2, and R3 provided by embodiments of the present application.

Among them, the structure of the red phosphorescent light emitting device (ref) in related art is shown in FIG. 27. The light emitting device includes a luminescent layer R-EML (420 Å) formed by doping the host materials and the guest materials, an electron barrier layer (R-prime) with a thickness of 600 Å, a hole transport layer (HTL) with a thickness of 1020 Å, a hole injection layer (HIL) with a thickness of 100 Å, a conductive glass substrate (Substrate), an electron transport layer (ETL) with a thickness of 350 Å, and a cathode (CTD) with a thickness of 120 Å.

The structure of the R1 device of FIG. 24 is shown in FIG. 8, the structure of the R2 device of FIG. 24 is shown in FIG. 9, and the structure of the R3 device of FIG. 25 is shown in FIG. 10. Among them, the three red phosphorescent light emitting devices R1, R2, and R3 also include an electron barrier layer (R-prime) with a thickness of 750 Å, a hole transport layer (HTL) with a thickness of 950 Å, the hole injection layer (HIL) with the thickness of 100 Å, the conductive glass substrate (Substrate), the electron transfer layer (ETL) with the thickness of 350 Å, and the cathode (CTD) with the thickness of 120 Å. The specific structure of the luminescent layer 1 of the three red phosphorescent light emitting devices R1, R2, and R3 may refer to in the previous introduction, and will not be repeated here.

From the curves in FIG. 24 and FIG. 25, it can be seen that the luminous efficiencies of the three red phosphorescent light emitting devices R1, R2, and R3 are all higher than that of the red phosphorescent light emitting device (ref) in related art.

FIG. 26 provides a diagram of luminous efficiency comparison curves of a blue fluorescent light emitting device (ref) in related art and three types of blue fluorescent light emitting devices B1, B2, and B3 provided by embodiments of the present application.

Among them, the structure of the blue fluorescent light emitting device (ref) in related art is shown in FIG. 27. The light emitting device includes a luminescent layer B-EML (200 Å) formed by doping the host materials and the guest materials, an electron barrier layer (B-prime) with a thickness of 50 Å, a hole transport layer (HTL) with a thickness of 1020 Å, a hole injection layer (HIL) with a thickness of 100 Å, a conductive glass substrate (Substrate), an electron transport layer (ETL) with a thickness of 350 Å, and a cathode (CTD) with a thickness of 120 Å.

The structure of the B1 device of FIG. 26 is shown in FIG. 5, the structure of the B2 device of FIG. 26 is shown in FIG. 6, and the structure of the B3 device of FIG. 26 is shown in FIG. 7. Among them, the three blue fluorescent light emitting devices B1, B2, and B3 also include the electron barrier layer (B-prime) with the thickness of 50 Å, the hole transport layer (HTL) with the thickness of 1020 Å, the hole injection layer (HIL) with the thickness of 100 Å, the conductive glass substrate (Substrate), the electron transfer layer (ETL) with the thickness of 350 Å, and the cathode (CTD) with the thickness of 120 Å. The specific structure of the luminescent layer 1 of the three blue fluorescent light emitting devices B1, B2, and B3 may refer to in the previous introduction, and will not be repeated here.

From the curves in FIG. 26, it can be seen that the luminous efficiencies of the luminous efficiency of the first type of blue fluorescent light emitting device B1 is equivalent to that of the blue fluorescent light emitting device (ref) in related art, while the luminous efficiencies of the second type and the third type of blue fluorescent light emitting devices B2 and B3 are both higher than that of the blue fluorescent light emitting device (ref) in related art.

It should be noted that the above luminous efficiency curves are tested under 15 $mA/cm^2$ current density conditions.

In addition, it should be noted that the light emitting device may also include other structures and components such as an electron injection layer, a hole barrier layer, an optical extraction layer (CPL). Here, only the structures related to the invention point are introduced. Other structures and components included in the light emitting device may refer to the introduction in related art.

The embodiment of the present application provides a display substrate, including a plurality of light emitting devices as described above, that are arranged in array.

In some embodiments, emitting colors of the plurality of light emitting devices in the display substrate may all the same. At this point, the display substrate may be used as a backlight.

In some embodiments, the emitting colors of the plurality of light emitting devices in the display substrate may include red, blue, and green at the same time. At this point, the display substrate may be used directly as a display.

In the display substrate provided by the embodiment of the present application, the emitting colors of the plurality of light emitting devices are partially different, and each of the plurality of light emitting devices includes a first light emitting device, a second light emitting device and a third light emitting device.

For example, the first light emitting device is the red light emitting device, the second light emitting device is the green light emitting device, and the third light emitting device is the blue light emitting device.

Among them, materials of the object sublayers 1K of the first light emitting device and the second light emitting device include the phosphor materials, and materials of the object sublayers 1K of the third light emitting device include the fluorescent materials.

For example, the first light emitting device includes red phosphor materials, and emits red light; the second light emitting device includes green phosphor materials, and emits green light; and the third light emitting device includes blue fluorescent materials, and emits blue light.

A quantity of the object sublayers 1K of the first light emitting device is greater than or equal to a quantity of the object sublayers 1K of the third light emitting device, and a quantity of the object sublayers 1K of the second light emitting device is greater than or equal to the quantity of the object sublayers 1K of the third light emitting device.

In the display substrate provided by the embodiment of the present application, the emitting colors of the plurality of light emitting devices are partially different, and each of the plurality of light emitting devices includes the first light emitting device, the second light emitting device, the third light emitting device and a fourth light emitting device.

For example, the first light emitting device is the red light emitting device, the second light emitting device is the green light emitting device, the third light emitting device is the blue light emitting device, and the fourth light emitting device is a white light emitting device.

Among them, materials of the object sublayers of the first light emitting device and the second light emitting device include the phosphor materials, materials of the object sublayers of the third light emitting device include the fluorescent materials, materials of a part of the object sublayers of the fourth light emitting device include the fluorescent materials, and materials of a part of the object sublayers of the fourth light emitting device include the phosphor materials.

For example, the first light emitting device includes red phosphor materials, and emits red light; the second light emitting device includes green phosphor materials, and emits green light; and the third light emitting device includes blue fluorescent materials, and emits blue light; the fourth light emitting device includes the red phosphor materials, the green phosphor materials and the blue fluorescent materials at the same time, and emits white light.

Certainly, the fourth light emitting device may also include the yellow phosphor materials, the green phosphor materials and the blue fluorescent materials at the same time, and emits white light.

A quantity of the object sublayers 1K of the first light emitting device and a quantity of the object sublayers 1K of the second light emitting device are both greater than or equal to a quantity of the object sublayers 1K of the fourth light emitting device, and the quantity of the object sublayers 1K of the fourth light emitting device is greater than or equal to a quantity of the object sublayers 1K of the third light emitting device.

Due to the fact that phosphorescence, also known as fluorescence luminescence, is more easily quenched, in the display substrate provided by the embodiment of the present application, by setting the guest sublayers 1K with more layers in the light emitting device with a higher content of phosphor materials, the quenching phenomenon of the phosphorescence device can be greatly improved, and the overall luminous efficiency of the display substrate may be improved.

In the display substrate provided by the embodiment of the present application, the emitting colors of the plurality of light emitting devices are all the same, and in the same light emitting device, the materials of a part of the object sublayers 1K include the fluorescent materials, and the materials of a part of the object sublayers 1K include the phosphor materials.

For example, as shown in FIG. 32 and FIG. 33, the emitting colors of the light emitting devices in the display substrate are all white.

For example, the materials of each object sublayer 1K of the luminescent layer 1B include the blue fluorescent materials, and the materials of a part of the object sublayers 1K of the luminescent layer 1YG include the green phosphor materials and the yellow phosphor materials.

The above display substrate also includes a driving backplane BP, a color filter layer CF, for example, including a red filter pattern CF-R, a green filter pattern CF-G, and a blue filter pattern CF-B. Certainly, the above display substrate may also include other structures and components. For details, please refer to the introduction in related art, which will not be repeated here.

The embodiment of the present application provides a display device, including the display substrate as described above.

The display device provided by the embodiment of the present application may be an OLED display device, wherein the OLED display device may include a glass-based OLED display device and a silicon-based OLED display device.

In addition, the display device may be a display device such as an OLED display, as well as any product or component with display functions such as a TV, digital camera, mobile phone, tablet, etc. that includes these display devices.

The display device provided by the embodiment of the present application improves the concentration quenching phenomenon of the luminescent layer in the light emitting device, enhances the luminous efficiency, and prolongs the service life of the device. In addition, compared with light emitting devices in related art, the difficulty of the evaporation process for the light emitting device is lower, and it can be prepared using existing processes and equipment, improving a utilization rate of the equipment and reducing costs.

The above is only the specific implementation method of the present application, but the scope of protection of the present application is not limited to this. Any technical personnel familiar with this technical field who can easily think of changes or replacements within the scope of technology disclosed in the present application should be covered within the scope of protection of the present application. Therefore, the protection scope of the present application should be based on the protection scope of the claims.

The invention claimed is:

1. A light emitting device, comprising a plurality of luminescent layers, wherein:

each of the plurality of luminescent layers comprises at least one subject sublayer and at least one object sublayer, and the at least one subject sublayer and the at least one object sublayer are disposed alternately;

thicknesses of at least a part of subject sublayers are greater than or equal to a thickness of the object sublayer; and thicknesses of a part of the subject sublayers are greater than or equal to the thickness of the object sublayer, and thicknesses of a part of the subject sublayers are less than the thickness of the object sublayer.

2. The light emitting device according to claim 1, wherein the light emitting device further comprises a hole transport layer and an electron transport layer, the plurality of luminescent layers are located between the hole transport layer and the electron transport layer; and electron mobility of each subject sublayer gradually increases along a direction from the hole transport layer pointing to the electron transport layer.

3. The light emitting device according to claim 2, wherein when a total quantity of the subject sublayers is N+1, a minimum distance from a geometric center of a ((N/2)+1)th subject sublayer to the hole transport layer is less than a minimum distance from the geometric center of the ((N/2)+1)th subject sublayer to the electron transport layer; and when the total quantity of the subject sublayers is N, a minimum distance from a geometric center of a (N/2)th subject sublayer to the hole transport layer is less than a minimum distance from the geometric center of the (N/2)th subject sublayer to the electron transport layer, and the minimum distance from the geometric center of the ((N/2)+1)th subject sublayer to the hole transport layer is less than the minimum distance from the geometric center of the ((N/2)+1)th subject sublayer to the electron transport layer; wherein N is an even number.

4. The light emitting device according to claim 2, wherein when a total quantity of the subject sublayers is N+1, a 1st subject sublayer is disposed close to the hole transport layer, a (N+1)th subject sublayer is disposed close to the electron transport layer, and a sum of thicknesses from the 1st subject sublayer to a (N/2)th subject sublayer is less than a sum of thicknesses from a ((N/2)+2)th subject sublayer to the (N+1)th subject sublayer; wherein N is an even number.

5. The light emitting device according to claim 2, wherein a ratio of a thickness of a subject sublayer with a minimum distance to the electron transport layer being the least to a thickness of an object sublayer with a minimum distance to the electron transport layer being the least is a first value;

a ratio of a thickness of a subject sublayer with a minimum distance to the hole transport layer being the least to a thickness of an object sublayer with a minimum distance to the hole transport layer being the least is a second value; and the first value is greater than or equal to the second value.

6. The light emitting device according to claim 1, wherein a thickness of each of the subject sublayers is greater than or equal to the thickness of the object sublayer.

7. The light emitting device according to claim 1, wherein materials of the object sublayers of a part of the luminescent layers comprise fluorescent materials, and materials of the object sublayers of a part of the luminescent layers comprise phosphor materials;

wherein a quantity of the object sublayers of the phosphor materials is greater than or equal to a quantity of the object sublayers of the fluorescent materials.

8. A display substrate, comprising a plurality of light emitting devices according to claim 1, that are arranged in array.

9. The display substrate according to claim 8, wherein emitting colors of the plurality of light emitting devices are partially different, and each of the plurality of light emitting devices comprises a first light emitting device, a second light emitting device and a third light emitting device;

wherein materials of the object sublayers of the first light emitting device and the second light emitting device comprise phosphor materials, materials of the object sublayers of the third light emitting device comprise fluorescent materials, a quantity of the object sublayers of the first light emitting device is greater than or equal to a quantity of the object sublayers of the third light emitting device, and a quantity of the object sublayers of the second light emitting device is greater than or equal to the quantity of the object sublayers of the third light emitting device.

10. The display substrate according to claim 8, wherein emitting colors of the plurality of light emitting devices are partially different, and each of the plurality of light emitting devices comprises a first light emitting device, a second light emitting device, a third light emitting device and a fourth light emitting device;

wherein materials of the object sublayers of the first light emitting device and the second light emitting device comprise phosphor materials, materials of the object sublayers of the third light emitting device comprise fluorescent materials, materials of a part of the object sublayers of the fourth light emitting device comprise the fluorescent materials, and materials of a part of the object sublayers of the fourth light emitting device comprise the phosphor materials; and a quantity of the object sublayers of the first light emitting device and a quantity of the object sublayers of the second light emitting device are both greater than or equal to a quantity of the object sublayers of the fourth light emitting device, and the quantity of the object sublayers of the fourth light emitting device is greater than or equal to a quantity of the object sublayers of the third light emitting device.

11. A display device, comprising the display substrate according to claim 8.

12. A light emitting device, comprising a plurality of luminescent layers, wherein:

each of the plurality of luminescent layers comprises at least one subject sublayer and at least one object sublayer, and the at least one subject sublayer and the at least one object sublayer are disposed alternately;

thicknesses of at least a part of subject sublayers are greater than or equal to a thickness of the object sublayer; and wherein at least one of the luminescent layers further comprises a doped sublayer, the doped sublayer is located between the subject sublayer and the object sublayer; and in a same luminescent layer, a thickness of the doped sublayer is greater than or equal to at least one of a thickness of the subject sublayer and a thickness of the object sublayer.

13. The light emitting device according to claim 12, wherein each of the luminescent layers comprises the doped sublayer, in the same luminescent layer, the thickness of the doped sublayer is greater than or equal to a sum of the thickness of the subject sublayer and the thickness of the object sublayer.

14. The light emitting device according to claim 13, wherein each of the luminescent layers comprises a middle area and an edge area surrounding the middle area, a thickness of a part of the doped sublayer located in the middle area is greater than a thickness of a part of the doped sublayer located in the edge area; and a thickness of a part of the subject sublayer located in the middle area is less than a thickness of a part of the subject sublayer located in the edge area, and/or, a thickness of a part of the object sublayer located in the middle area is less than a thickness of a part of the object sublayer located in the edge area.

15. The light emitting device according to claim 13, wherein materials of the doped sublayer comprise at least one of a material of the subject sublayer and a material of the object sublayer.

16. The light emitting device according to claim 15, wherein the doped sublayer comprises a host material and a guest material, the host material of the doped sublayer is the same as the material of the subject sublayer, and the guest material of the doped sublayer is the same as the material of the object sublayer.

17. The light emitting device according to claim 16, wherein the material of the object sublayer comprises phosphor materials, a LUMO energy level of the material of the subject sublayer is greater than a LUMO energy level of the material of the object sublayer, and a HOMO energy level of the material of the object sublayer is greater than a HOMO energy level of the material of the subject sublayer; wherein the LUMO energy level is an energy level of a lowest unoccupied molecular orbital, and the HOMO energy level is an energy level of a highest occupied molecular orbital.

18. The light emitting device according to claim 13, wherein materials of the object sublayers of a part of the luminescent layers comprise fluorescent materials, and materials of the object sublayers of a part of the luminescent layers comprise phosphor materials;

the subject sublayer is provided between the object sublayer of the phosphor materials and the object sublayer of the fluorescent materials, a first doped sublayer is provided between the object sublayer of the phosphor materials and the subject sublayer, and a second doped sublayer is provided between the object sublayer of the fluorescent materials and the subject sublayer;

wherein a guest material of the first doped sublayer comprises the phosphor materials and a guest material of the second doped sublayer comprises the fluorescent materials.

19. A light emitting device, comprising a plurality of luminescent layers, wherein:

each of the plurality of luminescent layers comprises at least one subject sublayer and at least one object sublayer, and the at least one subject sublayer and the at least one object sublayer are disposed alternately;

thicknesses of at least a part of subject sublayers are greater than or equal to a thickness of the object sublayer;

materials of the object sublayers of a part of the luminescent layers comprise fluorescent materials, and materials of the object sublayers of a part of the luminescent layers comprise phosphor materials;

a transition layer and the subject sublayer are provided between the object sublayer of the phosphor materials and the object sublayer of the fluorescent materials; and the transition layer is located between the subject sublayer and the object sublayer of the phosphor materials, or the transition layer is located between the subject sublayer and the object sublayer of the fluorescent materials; wherein the transition layer comprises a spacer sublayer or a charge transport sublayer.

* * * * *